US010541010B2

(12) United States Patent
Hollis

(10) Patent No.: US 10,541,010 B2
(45) Date of Patent: Jan. 21, 2020

(54) MEMORY DEVICE WITH CONFIGURABLE INPUT/OUTPUT INTERFACE

(71) Applicant: Micron Technology, Inc., Boise, ID (US)

(72) Inventor: Timothy M. Hollis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/058,588

(22) Filed: Aug. 8, 2018

(65) Prior Publication Data
US 2019/0287584 A1 Sep. 19, 2019

Related U.S. Application Data

(60) Provisional application No. 62/645,057, filed on Mar. 19, 2018.

(51) Int. Cl.
G11C 7/10 (2006.01)
H01L 25/065 (2006.01)
H01L 23/48 (2006.01)
G06F 13/16 (2006.01)
G11C 7/22 (2006.01)
G11C 11/408 (2006.01)
G11C 11/22 (2006.01)

(52) U.S. Cl.
CPC ........ G11C 7/1096 (2013.01); G06F 13/1668 (2013.01); G11C 7/22 (2013.01); H01L 23/481 (2013.01); H01L 25/0657 (2013.01); G11C 11/2255 (2013.01); G11C 11/2257 (2013.01); G11C 11/4087 (2013.01)

(58) Field of Classification Search
CPC .................................... G11C 7/00; G11C 7/08
USPC .......................................... 365/189.011, 207
See application file for complete search history.

(56) References Cited

U.S. PATENT DOCUMENTS 5,555,422 A * 9/1996 Nakano .............. G01R 1/07307
324/750.25
5,815,675 A 9/1998 Steele et al.
6,130,602 A * 10/2000 O'Toole ................ H03L 7/0995
340/10.33
6,144,542 A * 11/2000 Ker ..................... H01L 27/0251
361/111

(Continued)

Primary Examiner — Michael T Tran
(74) Attorney, Agent, or Firm — Holland & Hart LLP

(57) ABSTRACT

Methods, systems, and apparatuses for a memory device that is configurable based on the type of substrate used to couple the memory device with a host device are described. The reconfigurable memory device may include a plurality of components for different configurations. Various components of the reconfigurable memory die may be activated/deactivated based on a type of substrate used in the memory device. The memory device may include an input/output (I/O) interface that is variously configurable. A first configuration may cause the memory device to communicate signals modulated using a first modulation scheme across a channel of a first width. A second configuration may cause the memory device to communicate signals modulated using a second modulation scheme across a channel of a second width. The I/O interface may include one or more switching components to selectively couple pins of a channel together and/or selectively couple components to various pins.

20 Claims, 13 Drawing Sheets

(56) References Cited

U.S. PATENT DOCUMENTS

| | | | |
|---|---|---|---|
| 6,472,723 B1* | 10/2002 | Jarstad | H01L 21/743 257/503 |
| 9,349,455 B2 | 5/2016 | Kang et al. | |
| 9,412,450 B2 | 8/2016 | Lee et al. | |
| 10,074,423 B1 | 9/2018 | Hermesh et al. | |
| 10,191,799 B2 | 1/2019 | Karlik et al. | |
| 10,222,990 B2 | 3/2019 | Bazarsky et al. | |
| 10,236,909 B2 | 3/2019 | Rom et al. | |
| 10,289,557 B2 | 5/2019 | Duzly et al. | |
| 10,290,332 B1 | 5/2019 | Sim et al. | |
| 10,296,260 B2 | 5/2019 | Duzly et al. | |
| 10,296,473 B2 | 5/2019 | Benisty | |
| 2002/0140110 A1* | 10/2002 | Takahashi | H01L 23/49838 257/784 |
| 2004/0027907 A1* | 2/2004 | Ooishi | G11C 11/15 365/226 |
| 2004/0216724 A1* | 11/2004 | Uruno | F02P 3/051 123/644 |
| 2007/0168564 A1 | 7/2007 | Conley et al. | |
| 2008/0052452 A1 | 2/2008 | Chow et al. | |
| 2008/0071976 A1 | 3/2008 | Chow et al. | |
| 2013/0264490 A1* | 10/2013 | Takenaka | H04N 5/32 250/394 |
| 2014/0239274 A1* | 8/2014 | Jia | H01L 51/0096 257/40 |
| 2015/0050631 A1 | 2/2015 | Reynaldo | |
| 2016/0323143 A1 | 11/2016 | Kim et al. | |
| 2016/0358578 A1 | 12/2016 | Ito | |
| 2017/0019143 A1* | 1/2017 | Granger-Jones | H04B 1/48 |
| 2017/0155863 A1 | 6/2017 | Shikina et al. | |
| 2017/0185194 A1 | 6/2017 | Kim et al. | |
| 2017/0271358 A1* | 9/2017 | Mori | H01L 27/11565 |
| 2018/0039541 A1 | 2/2018 | Hahn et al. | |
| 2018/0047127 A1* | 2/2018 | Falkenstern | G06T 1/0021 |
| 2018/0352678 A1 | 12/2018 | Adams | |
| 2019/0065650 A1 | 2/2019 | Pelloie | |
| 2019/0116324 A1 | 4/2019 | Yamamoto | |

\* cited by examiner

MEMORY DEVICE WITH CONFIGURABLE INPUT/OUTPUT INTERFACE

CROSS REFERENCE

The present Application for Patent claims priority to and the benefit of U.S. Provisional Patent Application No. 62/645,057 by Hollis et al., entitled "Memory Device with Configurable Input/Output Interface," filed Mar. 19, 2018, assigned to the assignee hereof and is expressly incorporated by reference herein.

BACKGROUND

The following relates generally to devices and methods for memory devices with configurable input/output interfaces.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, but high reliability, low latency, and/or low-power devices tend to be expensive and unscalable. As the number of applications for high reliability, low latency, low-power memory increases, so too does the need for scalable, efficient, and cost-effective devices for such applications.

DETAILED DESCRIPTION

When manufacturing memory devices it may be advantageous to build a single memory die, or a single memory stack, or both that are compatible with multiple types of substrates. In this manner, as technology advancements occur and as memory needs change, the same memory die or memory stack may be utilized for different memory configurations, including different substrate configurations.

Techniques described herein relate to a memory device that is configurable based on the type of substrate used, including the type of substrate used to couple the memory device with a host device. The reconfigurable memory device may include a plurality components to support different configurations. Various components of the reconfigurable memory die may be activated, deactivated, or otherwise configured based on a type of substrate used in the memory device. The memory device may include an I/O interface, as one example, that is capable of a plurality of configurations. A first configuration of the I/O interface may cause the memory device to communicate signals modulated using a first modulation scheme across a channel of a first width. A second configuration of the I/O interface may cause the memory device to communicate signals modulated using a second modulation scheme across a channel of a second width. In some examples, the I/O interface may include one or more switching components to selectively couple pins of a channel together, or selectively couple components to various pins, or both.

Features of the disclosure introduced above are further described below in the context of an exemplary system illustrated in FIG. 1. Specific examples and other features are further illustrated by and described with reference to apparatus diagrams and system diagrams, (FIGS. 2-9) and flowcharts (FIGS. 10-12) that relate to reconfigurable memory architectures.

Figure 1:
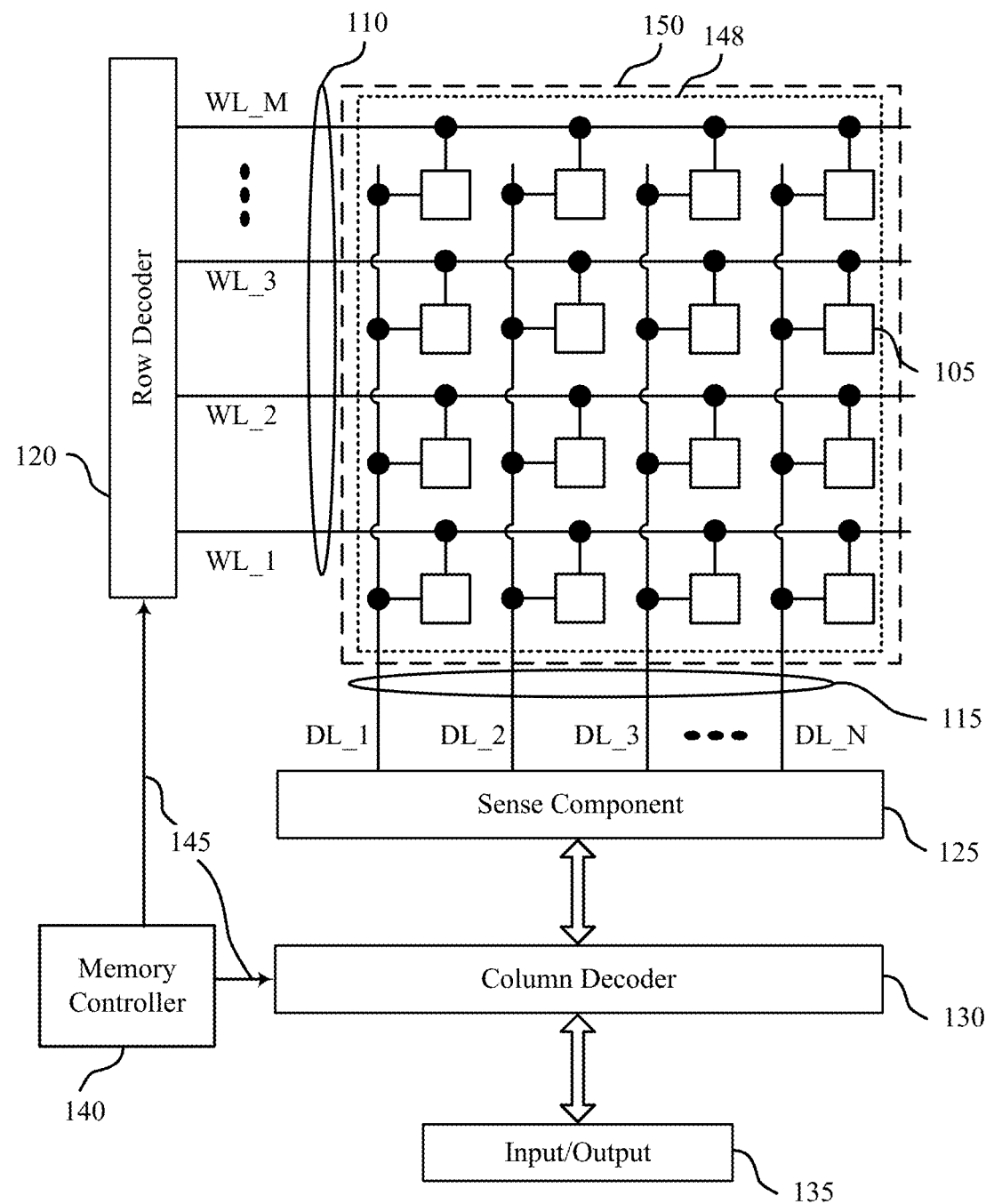
FIG. 1 illustrates an example of a memory die that supports memory devices with configurable input/output interfaces in accordance with examples of the present disclosure.

FIG. 1 illustrates an example memory die 100 in accordance with various aspects of the present disclosure. Memory die 100 may also be referred to as an electronic memory apparatus, a memory array, an array of memory cells, or a deck of memory cells, in some examples. The memory die 100 may include a memory array 148 that includes memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 is configured to store more than two logic states.

A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, may be electrically isolated from the digit line by a selection component (not shown). The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may result from biasing, or applying a voltage, to the capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A memory cell 105 may be written by applying a voltage across the capacitor. This process is discussed in more detail below.

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals in order to activate the desired word line 110 and digit line 115. The memory controller 140 may activate the desired word line 110 and digit line 115 of a specific bank of memory cells via at least one channel traversing the memory array 148. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

The memory controller 140 may also be configured to communicate commands, data, and other information with a host device (not shown). The memory controller 140 may use a modulation scheme to modulate signals communicated between the memory array and the host device. In some cases, the modulation scheme that is used may be selected based on the type of the communication medium (e.g., organic substrate or high-density interposer) used to couple the host device with the memory device. In some cases, an I/O interface may be configured based on what type of modulation scheme is selected.

Memory die 100 may include memory array 148, which may overlie a complementary metal-oxide-semiconductor (CMOS) area, such as CMOS under array (CuA) 150. Memory array 148 may include memory cells 105 that are connected to word lines 110 and digit lines 115. The CuA 150 may underlie the memory array 148 and include support circuitry. CuA 150 may underlie the row decoder 120, sense component 125, column decoder 130, and/or memory controller 140. Or CuA 150 may include one or more of row decoder 120, sense component 125, column decoder 130, and memory controller 140. The support circuitry may support one or more additional arrays of memory cells present in a stacked configuration. In a stacked configuration, CuA 150 may facilitate accessing one or more memory cells in each array. For example, CuA 150 may facilitate the transfer of data between a memory cell coupled to a channel of memory array 148, a memory cell coupled to a channel of an additional array that is coupled to memory array 148, and the controller.

In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously; for example, multiple or all cells of memory die 100 may be accessed simultaneously during a reset operation in which all memory cells 105, or a group of memory cells 105, are set to a single logic state.

Figure 2:
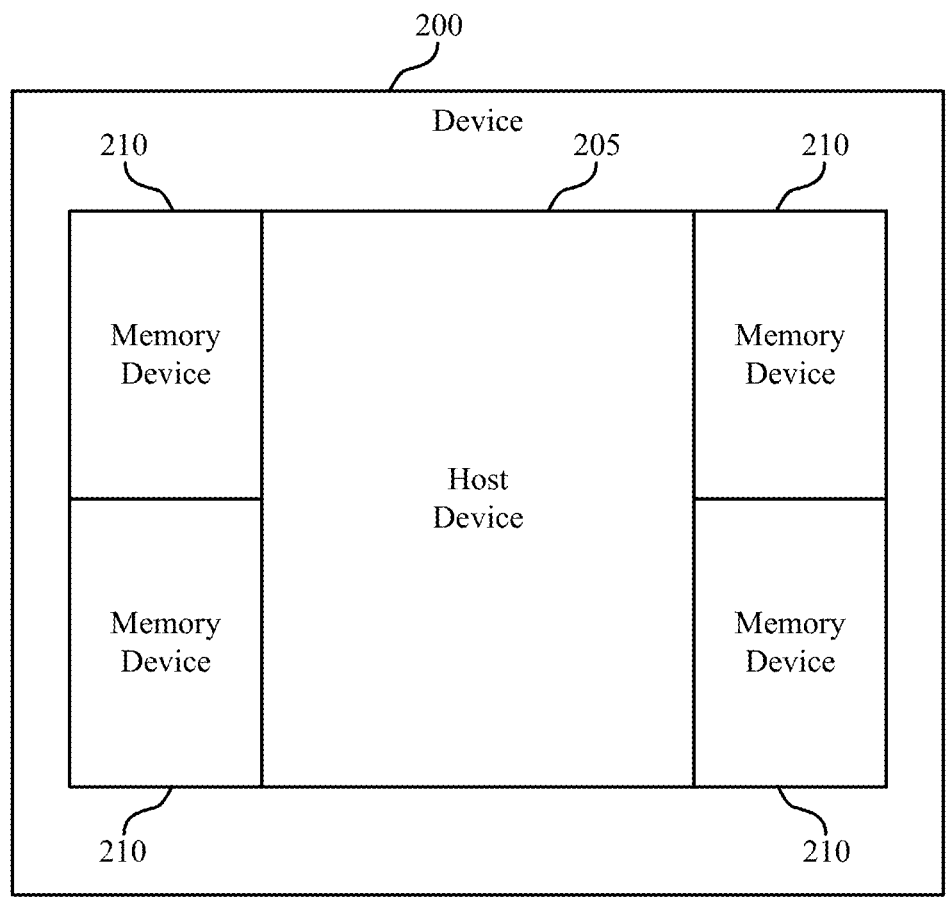
FIG. 2 illustrates an example of a device that supports memory devices with configurable input/output interfaces in accordance with examples of the present disclosure.

FIG. 2 illustrates an apparatus or system 200 that supports memory devices with configurable input/output interfaces in accordance with various examples of the present disclosure. The system 200 may include a host device 205 and a plurality of memory devices 210. The plurality of memory device 210 may be examples of a finer grain memory device (e.g., finer grain DRAM or finer grain FeRAM).

The host device 205 may be an example of a processor (e.g., a central processing unit (CPU), a graphics processing unit (GPU)) or a system on a chip (SoC). In some cases, the host device 205 may be separate component from the memory device such that the host device 205 may be manufactured separately from the memory device. In some cases, the host device 205 may be external to the memory device 210 (e.g., a laptop, server, personal computing device, smartphone, personal computer). In the system 200, the memory devices 210 may be configured to store data for the host device 205. The host device 205 may exchange information with the memory devices 210 using signals communicated over signal paths. A signal path may be any path that a message or transmission takes to get from a transmitting component to a receiving component. In some cases, a signal path may be a conductor coupled with at least two components, where the conductor may selectively allow electrons to flow between the at least two components. In some cases, the signal path may be formed in a wireless medium as in the case for wireless communications (e.g., radio frequency (RF) or optical). In some cases, the signal paths may at least partially include a high-density interposer, such as a silicon interposer. In some cases, the signal paths may at least partially include a first substrate, such as an organic substrate of the memory device, and a second substrate, such as a package substrate (e.g., a second organic substrate) that may be coupled with both the memory device 210 and the host device 205.

In some applications, the system 200 may benefit from a high-speed connection between the host device 205 and the memory devices 210. As such, some memory devices 210 support applications, processes, host devices, or processors that have multiple terabytes per second (TB/s) bandwidth needs. Satisfying such a bandwidth requirement within an acceptable energy budget may pose challenges.

The memory devices 210 may be configured such that the signal path between the memory cells in the memory devices 210 and the host device 205 are as short as the material properties, operating environment, component layout, and application allow. For example, the memory devices 210 may be bufferless memory devices with a point-to-point connection between the host device and the memory array. In another example, the data channels coupling a memory device 210 with the host device 205 may comprise a point-to-many-point configuration, with one pin of the host device 205 coupled with corresponding pins of at least two memory arrays. In another example, the data channels coupling a memory device 210 with the host device 205 may be configured to be shorter than previous designs, such as other near memory applications (e.g., a graphics card employing GDDR5-compliant DRAM).

In some cases, a high-density interposer (e.g., a silicon interposer or a glass interposer) may be used to couple the memory devices 210 with the host device 205. Depending on the requirements of the host device 205 (e.g., bandwidth requirements), various different types of communication mediums may be used (e.g., silicon interposers or organic interposers). The memory dies of the memory devices 210 may be configured to work with multiple types of communication mediums (e.g., interposers and/or multiple types of substrates such as organic substrates). As such, the memory dies of the memory devices 210 may be reconfigurable based on a type of communication medium (e.g., substrate or high-density interposer) used to couple the host device 205 with the memory devices 210.

In some cases, a configuration of one or more input/output (I/O) interfaces of the memory device 210 may be adjusted based on the type of substrate used to couple with host device 205 with the memory device 210. In some cases, a high-density interposer (e.g., a silicon interposer or glass interposer) may be used as the substrate that couples the host device 205 with the memory device 210. In some cases, an organic substrate may be used as the substrate that couples the host device 205 with the memory device 210. For example, the one or more I/O interfaces may be configured to use two or more through silicon vias (TSVs) in different ways based on the type of interposer and/or a type of substrate used to couple the host device 205 with the memory device 210.

In some cases, the one or more I/O interfaces may be configured to change which modulation scheme is being used to modulate signals communicated between the host device 205 and the memory device 210. For example, a binary-level modulation scheme (e.g., non-return-zero (NRZ)) may be used with certain interposers/substrates and a multi-level modulation scheme (e.g., four-level pulse amplitude modulation (PAM4)) may be used with other interposers/substrates.

Figure 3:
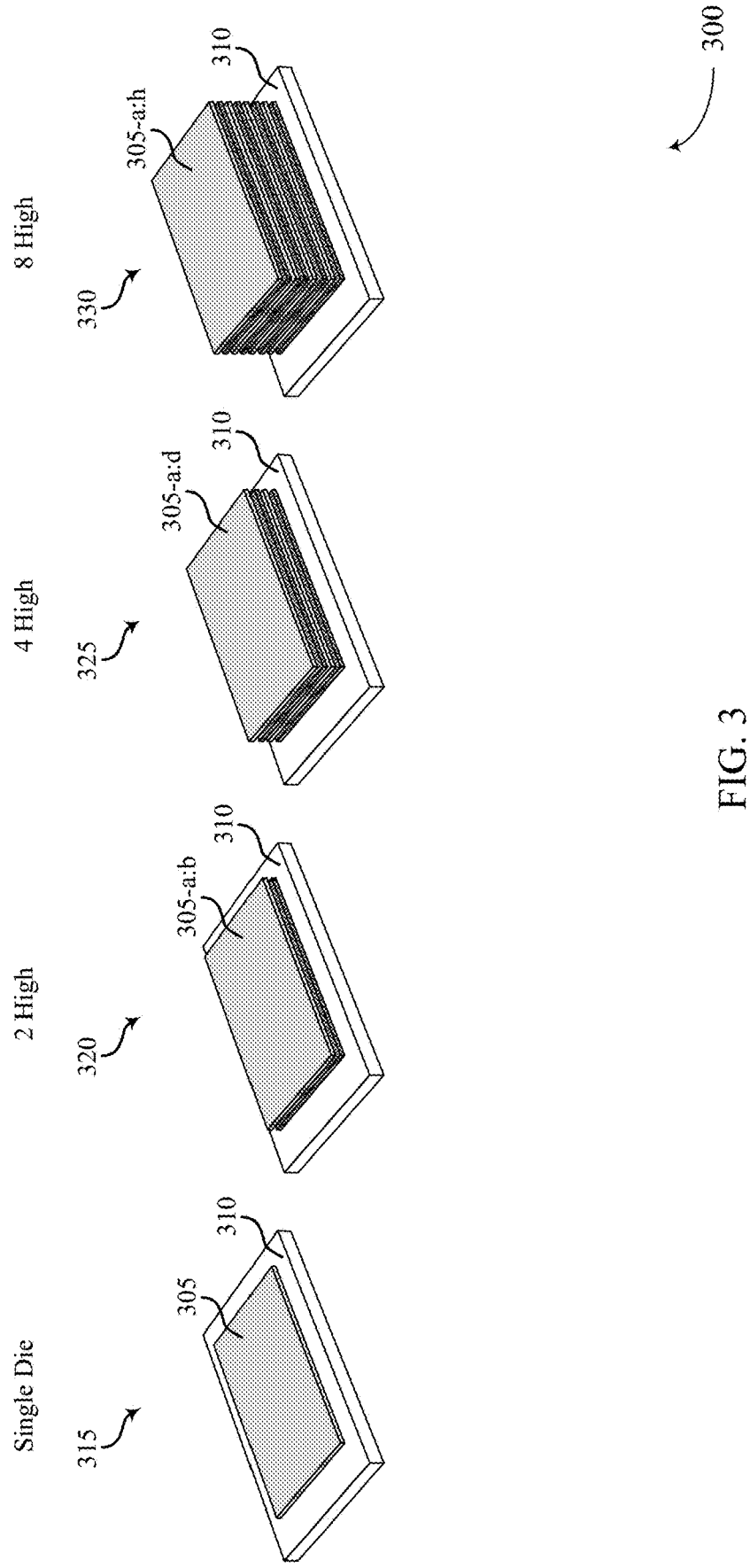
FIG. 3 illustrates an example of a device that supports memory devices with configurable input/output interfaces in accordance with examples of the present disclosure.

FIG. 3 illustrates an example of a device or devices 300 with configurable input/output interfaces in accordance with various examples of the present disclosure. The memory devices 300 include at least one memory die 305 and a communication medium 310.

The memory die 305 may include a plurality of memory cells (as shown in and described with reference to FIG. 1)

that may be programmable to store different logic states. For example, each memory cell may be programmed to store one or more logic states (e.g., a logic '0', a logic '1', a logic '00', a logic '01', a logic '10', a logic '11'). The memory cells of the memory dies 305 may use any number of storage technologies to store data including DRAM, FeRAM, phase change memory (PCM), 3D XPoint™ memory, NAND memory, NOR memory, or a combination thereof. In some cases, a single memory device may include a first memory die that uses a first memory technology (e.g., DRAM) and a second memory die that uses second memory technology (e.g., FeRAM) different from the first memory technology.

In some cases, the memory dies 305 may be an example of two-dimensional (2D) array of memory cells. In some cases, multiple memory dies 305 may be stacked on top of one another to form a three-dimensional (3D) array. In some examples, a memory die may include multiple decks of memory cells stacked on top of one another. Such a configuration may increase the number of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 305 may be stacked directly on one another. In other cases, one or more of the memory dies 305 may be positioned away from a stack of memory dies (e.g., in different memory stacks).

For example, a first memory device 315 may be an example of a single die package that includes a single memory die 305 and a communication medium 310. A second memory device 320 may be an example of a two-high device that includes two memory dies 305-a:b and a communication medium 310. A third memory device 325 may be an example of a four-high device that includes four memory dies 305-a:d and a communication medium 310. A fourth memory device 330 may be an example of an eight-high device that includes eight memory dies 305-a:h and a communication medium 310. A memory device 300 may include any number of memory dies 305 stacked on top of a common interposer (e.g., a common substrate). The dies are shown as different shadings to more clearly demonstrate the different layers. In some cases, the memory dies in different layers may be configured similarly as adjacent dies in the memory device.

The memory dies 305 may include one or more vias (e.g., TSVs). In some cases, the one or more vias may be part of internal signal paths that couple controllers with memory cells. The vias may be used to communicate between memory dies 305, for example, when the memory dies 100 are stacked on one another. In some cases, some vias may be used to facilitate communication between a controller of the memory device and at least some of the memory dies 305. In some cases, a single via may be coupled with multiple memory dies 305.

The communication medium 310 may be any structure or medium used to couple the memory dies 305 with a host device (not shown in FIG. 3) such that signals may be exchanged between the memory dies 305 and the host device. The communication medium 310 may be an example of a substrate, an organic substrate, a high-density interposer, a silicon interposer, a glass interposer, silicon photonics, optical communications, or other wireline communications. In some cases, the communication medium 310 may be any structure that could benefit from a multi-configurable I/O. In some cases, the communication medium 310 may be positioned above, below, or to the side of a memory array. The communication medium 310 may not be limited to being underneath other components but may be in any configuration relative to the memory array and/or other components. In some instances, the communication medium may be referred to as a substrate 310, however, such references are not to be considered limiting.

The communication medium 310 may be formed of a different types of materials. In some cases, the communication medium 310 be one or more organic substrates. For example, the communication medium 310 may include a package substrate (e.g., an organic substrate) coupled with both the host device and the stack of memory dies 305. In another example, the communication medium 310 may include an organic substrate of the memory device and the package substrate. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some cases, the communication medium 310 may be a high-density interposer such as a silicon interposer or a glass interposer. Such high-density interposer may be configured to provide wide communication lanes between connected components (e.g., a memory device and a host device). The high-density interposer may include a plurality channels that may exhibit a high-resistance (e.g., relatively lossy) for communicating between devices. In some cases, the channels may be highly resistive due to the dimensions of the conductor used to form the channel. The channels may be completely independent of one another in some cases. Some channels may be unidirectional and some channels may be bidirectional.

The high-density interposer may provide wide communication lanes by offering a high number of channels to connect components. In some cases, the channels may be thin traces of connecter (e.g., copper), thereby making each individual channel lossy. Because each channel may be highly resistive, as the frequency of data transferred increases, the power needed to transfer the data goes up in a non-linear relationship with the frequency. Such characteristics may impose a practical frequency ceiling that can be used to transmit data given an amount of transmit power over a channel of the silicon interposer. To increase the amount of data transferred in a given amount of time, the high-density interposer may include a very high number of channels. As such, a bus of the memory device that uses a high-density interposer may be wider than buses of other types of memory devices (e.g., memory devices that use organic substrates) used in some DRAM architectures, such as DDR4 (double data rate fourth-generation synchronous dynamic random-access memory) or GDDR5 (double data rate type five synchronous graphics random-access memory). The substrate (whether it is silicon, glass, or organic) may be formed of a first material (e.g., silicon, glass, or organic) that is different from a second material that forms a substrate of the package. In some cases, the first material may be the same as the second material.

Figure 4:
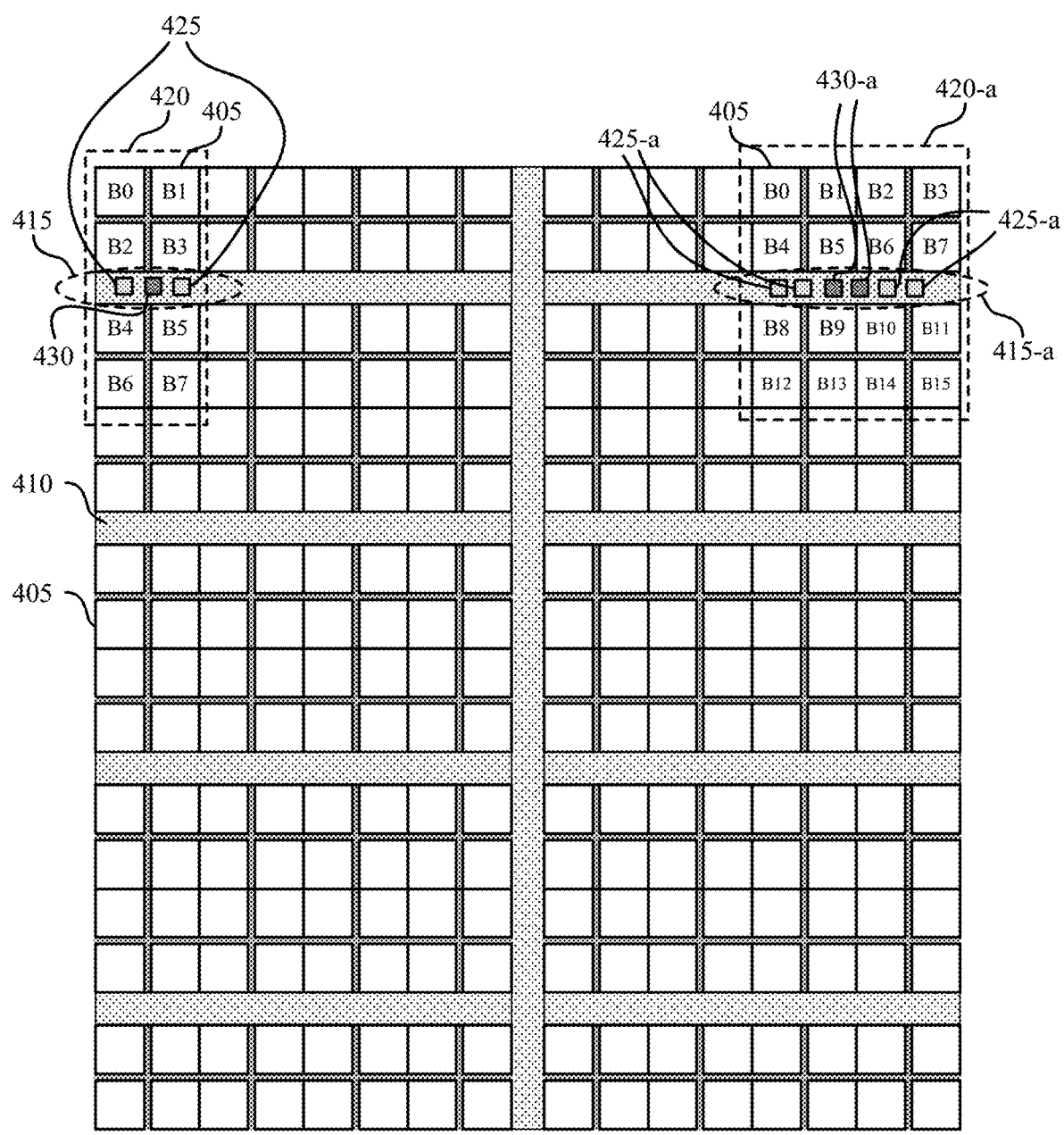
FIG. 4 illustrates an example of a memory die that supports memory devices with configurable input/output interfaces in accordance with examples of the present disclosure.

FIG. 4 illustrates an example of a memory die 400 that may be configurable with input/output interfaces in accordance with various examples of the present disclosure. The memory die 400 may be an example of a memory die 305 described with reference to FIG. 3. In some cases, the memory die 400 may be referred to as a memory array, an array of memory cells, or a deck of memory cells. The various components of the memory die 400 may be configured to facilitate high bandwidth data transfer between the host device and a memory device with which the memory die 400 is associated.

The memory die 400 may include a plurality of banks 405 of memory cells (as represented by the white boxes), a plurality of I/O channels 410 (sometimes referred to as I/O regions) traversing the memory cells of the memory die 400, and a plurality of data channels 415 that couple the memory die 400 with the host device. Each of the banks 405 of memory cells include a plurality of memory cells configured to store data. The memory cells may be DRAM memory cells, FeRAM memory cells, or other types of memory cells described herein. The plurality of I/O channels 410 may include a plurality of power pins and ground pins configured to couple the memory cells of the memory die 400 with power and ground.

The memory die 400 may be divided into cell regions 420 associated with different data channels 415. For example, a single data channel 415 may be configured to couple a single cell region 420 to the host device. The pins of the I/O channel may be configured to couple multiple cell regions 420 of the memory die 400 to power, ground, virtual ground, and/or other supporting components.

To provide a high throughput of data (e.g., multiple TB/s) between a host device (not shown) and the memory die 400, a path length between any given memory cell and the host interface may be shortened, as compared to previous solutions. In addition, shortening the data path between any given memory cell and the host device may also reduce the power consumed during an access operation (e.g., read operation or write operation) of that given memory cell. A number of different architectures and/or strategies may be employed to reduce the size of the data path.

In some examples, the memory die 400 may be partitioned into a plurality of cell regions 420. Each cell region 420 may be associated with a data channel 415. Two different types of cell region 420 are illustrated, but the entire memory die 400 may be populated with any number of cell regions 420 having any shape. A cell region 420 may include a plurality of banks 405 of memory cells. There may be any number of banks 405 in a cell region 420. For example, the memory die 400 illustrates a first cell region 420 that includes eight banks 405 and a second cell region 420-a that includes sixteen banks 405-a. Other numbers of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 420 may be selected based on the bandwidth requirements of the host device, the power requirements of the host device or the memory device, the size of the data channel, the type of interposer used to couple the memory die 400 with the host device, a data rate associated with the data channel, other considerations, or combinations thereof. In some cases, the memory die 400 may be partitioned such that each cell region 420 is the same size. In other cases, the memory die 400 may be partitioned such that the memory die 400 has cell regions 420 of different sizes.

A data channel 415 (associated with a cell region) may include a number of pins for coupling the memory cells of the cell region 420 with the host device. At least a portion of the data channel 415 may comprise channels of the substrate (e.g., high-density interposer or organic substrate). The data channel 415 may include a data width specifying how many data pins 425 (sometimes referenced as DQ pins) are in the data channel 415. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 430. Each memory cell in the cell region 420 may be configured to transfer data to and from the host device using the pins 425, 430 associated with the cell region 420. The data channel 415 may also include a clock pin (e.g., CLK) and/or a read clock pin or a return clock pin (RCLK).

In some cases, the channel width of the data channel may vary based on the type of communication medium (e.g., high-density interposer or organic substrate) used to couple the memory device and the host device. For example, if a first substrate (e.g., a high-density interposer) is used to couple the memory device and the host device, then the channel width may be X8. In another example, however, if a different substrate (e.g., an organic substrate) is used to couple the memory device and the host device, then the channel width may be X4. An I/O interface (not shown in FIG. 4) of the memory die 400 may be configured to support both channel widths. In some instances, to maintain data bandwidth, data throughput, or data accessibility, different modulation schemes may be used to communicate data across channels with different widths. For example, PAM4 may be used to modulate signals communicated across an X4 channel and NRZ may be used to modulate signals communicated across an X8 channel.

In some cases, the I/O channel 410 may bisect the banks 405 of memory cells in the cell region 420. In this manner, the data path for any individual memory cell may be shortened. The C/A pin 230 may be configured to communicate command frames between the memory die 400 and the host device.

Figure 5:
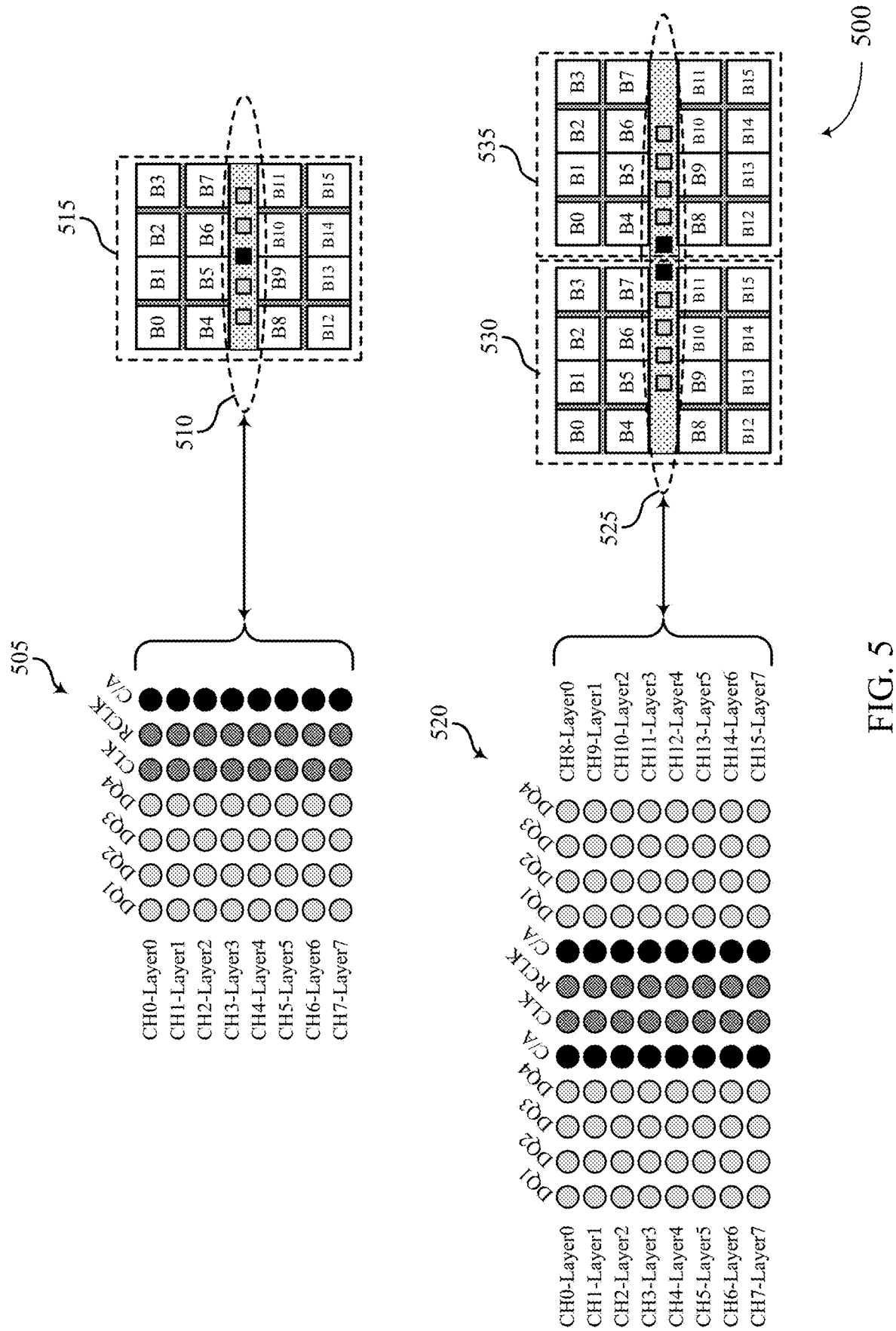
FIG. 5 illustrates an examples of data channels that support memory devices with configurable input/output interfaces in accordance with examples of the present disclosure.

FIG. 5 illustrates an example of a data channel configurations 500 that support memory devices with configurable input/output interfaces in accordance with various examples of the present disclosure. For example, a first data channel configuration 505 illustrates an independent data channel 510 that services a first cell region 515. A second data channel configuration 520 illustrates a data channel pair 525 where data channels for two cell regions (e.g., second cell region 530 and third cell region 535) share clock pins. In some cases, the channel width of the data channel configurations may be adjustable based at least in part on a type of communication medium (e.g., organic substrate or high-density interposer) used to couple the host device with the memory device. For example, if an organic substrate is used, the data channel may have a first channel width, and, if a high-density interposer is used, the data channel may have a second channel width that is larger than the first channel width (e.g., twice as big).

The data channel 510 illustrates a data channel for a stacked memory device that includes eight layers that has a channel width of four (e.g., there are four data pins). Each row of pins in the data channel 510 are associated with a cell region in a separate layer. The first cell region 515 illustrates a cell region of only a single layer. As such, the first cell region 515 is associated with a single row of the pins of the data channel 510. The number of pins in a data channel may be based on the number of layers in the memory device because a single data channel may be configured to couple with multiple layers. In some cases, the term data channel may refer to pins associated with a single cell region of a single layer. In some cases, the term data channel may refer to pins associated with multiple cell regions across multiple layers. In some examples, data channels are coupled with only a single cell region of any given layer or memory die. The same may also be true for the data channel pair 525 of the second data channel configuration 520. The data channel pair 525 shows pins for cell regions across multiple layers of the memory device. Although data channel 510 and data channel pair 525 shown are associated with cell regions in eight layers, any number of layers are possible. For example, the data channel 510 and data channel pair 525 may be associated with cell regions in one, two, three, four, five, six, seven, eight, nine, ten, eleven, twelve, thirteen, fourteen, fifteen, or sixteen layers of the memory device.

The data channel 510 includes four data pins (DQ0-DQ4), a clock pin (CLK), a read clock pin or return clock pin (RCLK), and a command/address pin (CA). In other cases, the data channel may have a different rank or different channel width. In such situations, the number of data pins may be different. For example, the data channel 510 may have a channel width of eight and may include eight data pins. Any number of data pins associated with a region are contemplated by this disclosure. The data channel 510 may include any number of C/A pins. For example, the data channel 510 may include one, two, three, or four C/A pins. In some cases, the data channel 510 may include an error correction code (ECC) pin (not shown) for facilitating error detection and correction procedures.

The data channel pair 525 is similarly embodied as the data channel 510 except that two data channels associated with two different cell regions are configured to share clock pins. As such, in the data channel pair 525, the clock pins (e.g., CLK and RCLK) are coupled with two cell regions of the same layer of the memory device, while the other pins of the data channel pair 525 (e.g., DQ pins, C/A pins, ECC pins) are coupled with a single cell region of a single layer. For example, the illustrated data channel pair 525 has a width of four. As such, four data pins and one C/A pin (e.g., CH0-Layer0) are coupled with the second cell region 530 and four data pins and one C/A pin (CH8-Layer0) are coupled with the third cell region 535.

The data channel pair 525 may reduce the complexity of a memory device and the power consumption of the memory device. For example, by sending a single set of clock signals to two cell regions in a layer, it may reduce the number of clock components in the memory device and thereby reduce the amount of power to drive the clock signals.

In some cases, the channel widths of the data channels may be configurable based on the type of substrate used to couple the host device and the memory device and/or the type of modulation scheme used to modulate signals communicated between the host device and the memory device. Different types of substrates may be able to support different signal frequencies. For example, organic substrates may be configured to support higher signal frequencies than high-density interposers (e.g., silicon and/or glass) because of the size of the wires used to communicate the signals. In such examples, high-density interposers may be configured to transfer data at the same rate as organic substrates by using a wider channel.

Memory devices may be configured to support both organic substrates and high-density interposers. Memory devices also may be configured to support a predetermined rate of data transfer regardless of the type of connection between the host device and the memory device. Such configurations may enable a single type of memory device to be used in a wide-range of commercial applications. To support specified data rates for both organic substrates and high-density interposers, the memory device may include I/O interfaces that are configurable between two or more configurations. Such configurations may allow the memory device to alter its channel width, modulation scheme, signal frequency, or other features, or combinations thereof based on the type of connection used between the host device and the memory device.

Figure 6A:
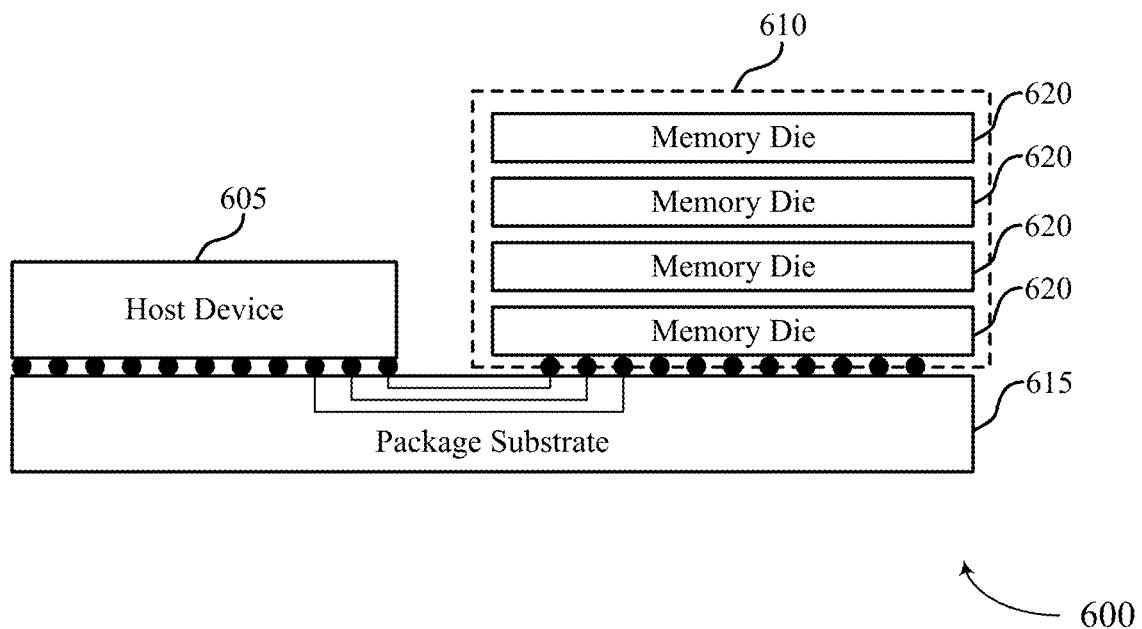
FIGS. 6A and 6B illustrate examples of devices that support memory devices with configurable input/output interfaces in accordance with examples of the present disclosure.

FIG. 6A illustrates an example of a device 600 that supports memory devices with configurable input/output interfaces in accordance with various examples of the present disclosure. The device 600 may be an example of a device where a host device 605 is coupled with a memory device 610 using a package substrate 615. The device 600 may be an example of the system 200 described with reference to FIG. 2. The host device 605 may be an example of the host device 205 and other host devices described with reference to FIGS. 2-5. The memory device 610 may be an example of the memory devices 210, 300 and portions of memory devices described with reference to FIGS. 2-5. The package substrate 615 may be an example of the substrate described with reference to FIG. 3. The memory device 610 may include one or more memory dies 620. The memory dies 620 may each be examples of the memory dies 305 or memory die 400 as described with reference to FIGS. 3 and 4. In some cases, the memory dies 620 may be referred to as memory arrays, arrays of memory cells, or decks of memory cells.

Various parameters and characteristics of the memory device 610 may be determined based on performance requirements of the overall device 600. For example, if the host device 605 requests that information be exchanged with the memory device 610 at a specific bandwidth (e.g., four terabytes per second (TB/s)) and the substrate 615 is organic-based, various characteristics of the memory device 610 may be selected based on these constraints. The package substrate 615 may be an example of an organic substrate or an organic-based substrate that are formed from compounds made of carbon and hydrogen atoms.

The package substrate 615 may include a plurality of channels that couple the memory device 610 with the host device 605. Such channels may have a particular resistance and that resistance may impact an amount of power it takes to transmit data at a given data rate or frequency. As the frequency of the signal communicated using the package substrate 615 increases, the amount of power needed to transmit the signal may increase in a non-linear relationship. A data rate of the memory device 610 may be based on the type of substrate used to communicate signals. In some cases, the data rate of the memory device 610 may also be based on the performance requirements of the host device 605. For example, as the performance requirements of the host device 605 go up, the acceptable threshold for power consumption may also go up.

Other characteristics of the memory device 610 may also be determined based on the performance requirements and/or the type of communication medium. For example, the channel width of the data channel may be determined. In many memory devices, the amount of data channels may be fixed by legacy technology (e.g., the number of data channels between the host device 605 and the memory device 610 may be sixteen data channels). As the channel width goes up, the number of pins used to communicate payload data, control data, and/or clock signals may be increased. In other examples, the number of banks in a cell region, or said another way, the number of banks accessed using a single data channel, may be determined based on the performance requirements and/or the type of communication medium. In other examples, the number of clock signals used in the memory device may be determined based on the performance requirements and/or the type of communication medium.

In addition, various characteristics of the clock signals may be determined based on the performance requirements and/or the type of communication medium. For example, the frequency and phase of the clock signals may be determined based on the performance requirements and/or the type of communication medium. In other examples, the use of an ECC pin may be determined based on the performance requirements and/or the type of communication medium. In other examples, pin drivers may be activated or deactivated based on the performance requirements and/or the type of communication medium. In other examples, whether the memory device includes data channel pairs may be based on the performance requirements and/or the type of communication medium. In other examples, a modulation scheme (e.g., NRZ or PAM4) for signals communicated over the pins may be determined based on the performance requirements and/or the type of communication medium.

In some examples, the memory device 610 with the package substrate 615 may be configured to meet a fixed performance requirement (e.g., 4 TB/s) of the host device 605. In such examples, the memory device 610 may have a data rate of 16 GB/s, the channel width of the data channel may be four data pins (e.g., X4) with a single C/A pin (e.g., data channel 510 as described with reference to FIG. 5), the number of banks of memory cells in a cell region may be sixteen, and the memory device 610 may include a 4-phase clock signal. The 4-phase clock signal may include a first signal at 4 GHz and a phase of zero, a second signal at 4 GHz and a phase of 90 degrees, a third signal at 4 GHz and a phase of 180 degrees, and a fourth signal at 4 GHz and a phase of 270 degrees. In other examples, the frequencies and the phases of the clock signals may be different.

These various parameters of the memory device 610 with the package substrate 615 may be configured to meet various performance requirements of the host device 605. As such, as performance requirements change, so too can the exact configuration of the memory device 610.

Figure 6B:
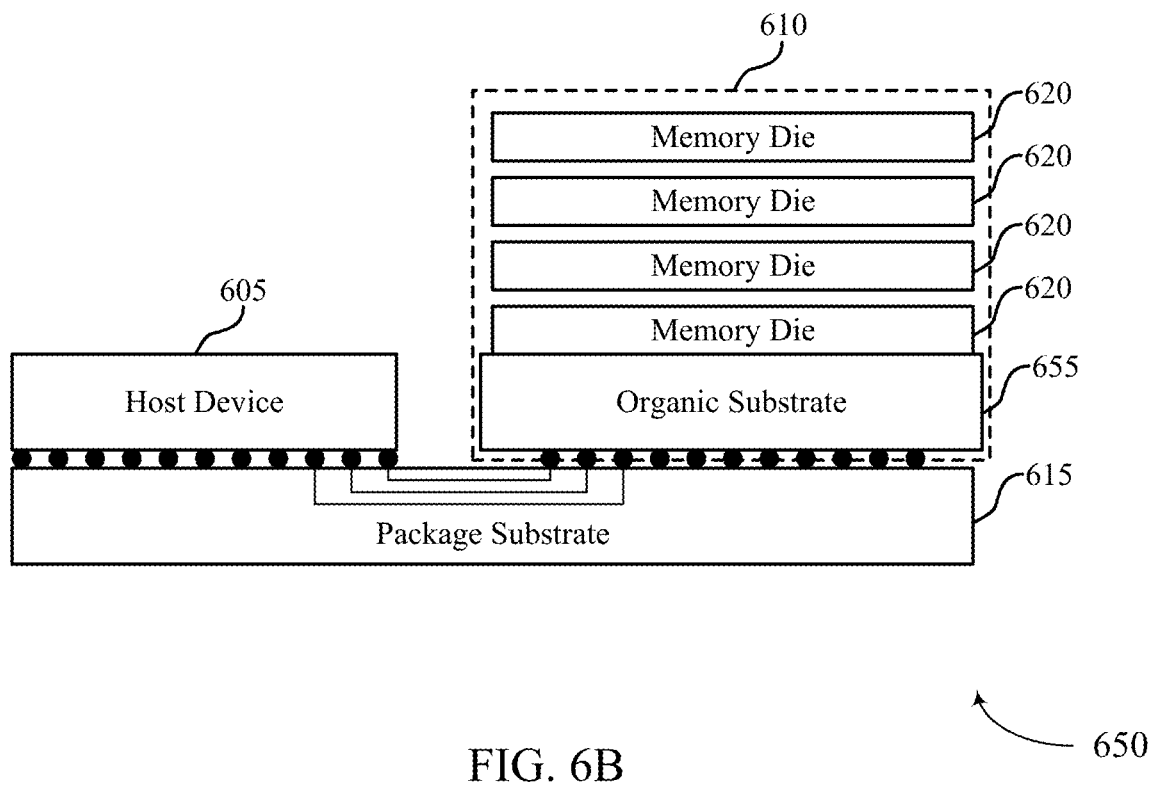

FIG. 6B illustrates an example of a device 650 that supports memory devices with configurable input/output interfaces in accordance with various examples of the present disclosure. The device 650 may be an example of a device where a host device 605 is coupled with a memory device 610 using a package substrate 615. The device 650 may be similarly embodied as the device 600 except the device 650 (or the memory device 610) may include an organic substrate 655 positioned between the package substrate 615 and the memory device 610.

The organic substrate 655 may include multiple metal layers configured to couple the data pins of the memory dies 620 with the pins of the package substrate 615. The organic substrate 655 may be configured to allow the memory device 610 to be tested (or otherwise activated) prior to being coupled with the host device 605. The organic substrate 655 may also be configured to allow the host device 605 to be coupled with the memory device 610 using IR reflow methods. In some cases, the organic substrate 655 may be between approximately 200 micrometers thick and approximately 300 micrometers thick. In some cases, the organic substrate 655 may be approximately 60 micrometers thick.

Figure 7:
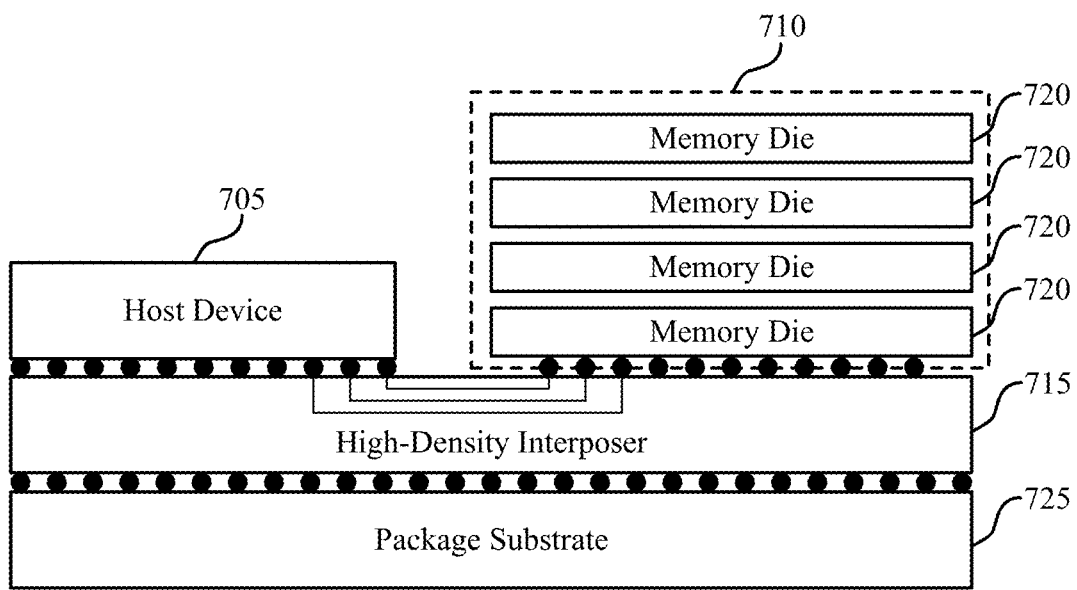
FIG. 7 illustrates an example of a device that supports memory devices with configurable input/output interfaces in accordance with examples of the present disclosure.

FIG. 7 illustrates an example of a device 700 that supports memory devices with configurable input/output interfaces in accordance with various examples of the present disclosure. The device 700 may be an example of a device where a host device 705 is coupled with a memory device 710 using a high-density interposer 715 (e.g., a silicon interposer or a glass interposer). The device 700 may also include a package substrate 725 formed of an organic material. The package substrate 725 may be configured to provide structure and/or provide rigidity for the high-density interposer 715. The package substrate 725 may be an example of the substrate 310, 615 described with reference to FIGS. 3 and 6.

The device 700 may be an example of the system 200 described with reference to FIG. 2. The host device 705 may be an example of the host device 205 and other host devices described with reference to FIGS. 2-5. The memory device 710 may be an example of the memory devices 210, 300 and portions of memory devices described with reference to FIGS. 2-5. The high-density interposer 715 may be an example of the substrate described with reference to FIG. 3. The memory device 710 may include one or more memory dies 720. The memory dies 720 may each be examples of the memory dies 305 or memory die 400 as described with reference to FIGS. 3 and 4. In some cases, the memory dies 720 may be referred to as memory arrays, arrays of memory cells, or decks of memory cells.

Like the memory device 610 described with reference to FIG. 6, the various parameters and characteristics of the memory device 710 may be determined based on the performance requirements. Because the interposer may be made of silicon or glass, the specific configuration of the memory device 710 may be different than the memory device 610 to achieve the same performance requirements.

One difference between a high-density interposer 715 and an organic substrate, such as the package substrate 615 in some examples, is that the resistance of the channels in the high-density interposer 715 is higher than the channels in the organic substrate. This is typical due to the channels of the high-density interposer 715 being smaller than the channels of the organic substrate. In some cases, the maximum practical data rate (given power consumption) of the high-density interposer 715 may be lower than an organic substrate because of the resistance of the channels at high frequencies. The difference in data rate may also lead to other parameters of the memory device 710 being different than the memory device 610.

In some examples, the memory device 710 with the high-density interposer 715 may be configured to meet a fixed performance requirement (e.g., a data rate of 4 TB/s) of the host device 705. In such examples, the memory device 710 may have a data rate of 8 GB/s, the channel width of the data channel may be eight data pins (e.g., X8) with a at least two C/A pins, the number of banks of memory cells in a cell region may be sixteen, and the memory device 710 may include a 4-phase clock signal.

These various parameters of the memory device 710 with the high-density interposer 715 may be configured to meet various performance requirements of the host device 705. As such, as performance requirements change, so to can the exact configuration of the memory device 710.

One disadvantage of a high-density interposer 715 as compared with the package substrate 615 may be the cost of the high-density interposer 715. The high-density interposer 715 may have lower yield rates in manufacturing or may be made of a more expensive material, or both, and may therefore cost more. One advantage of the high-density interposer 715 may be that the performance of the high-density interposer may improve in the future. In some cases, the device 700 does not include (e.g., is exclusive of) an organic substrate positioned between the high-density interposer 715 and the host device 705 and the high-density interposer 715 and the memory device 610. In other cases, however, the device 700 may include an organic substrate (like the organic substrate 655) positioned between the high-density interposer 715 and the memory dies 720 of the memory device 710.

Figure 8:
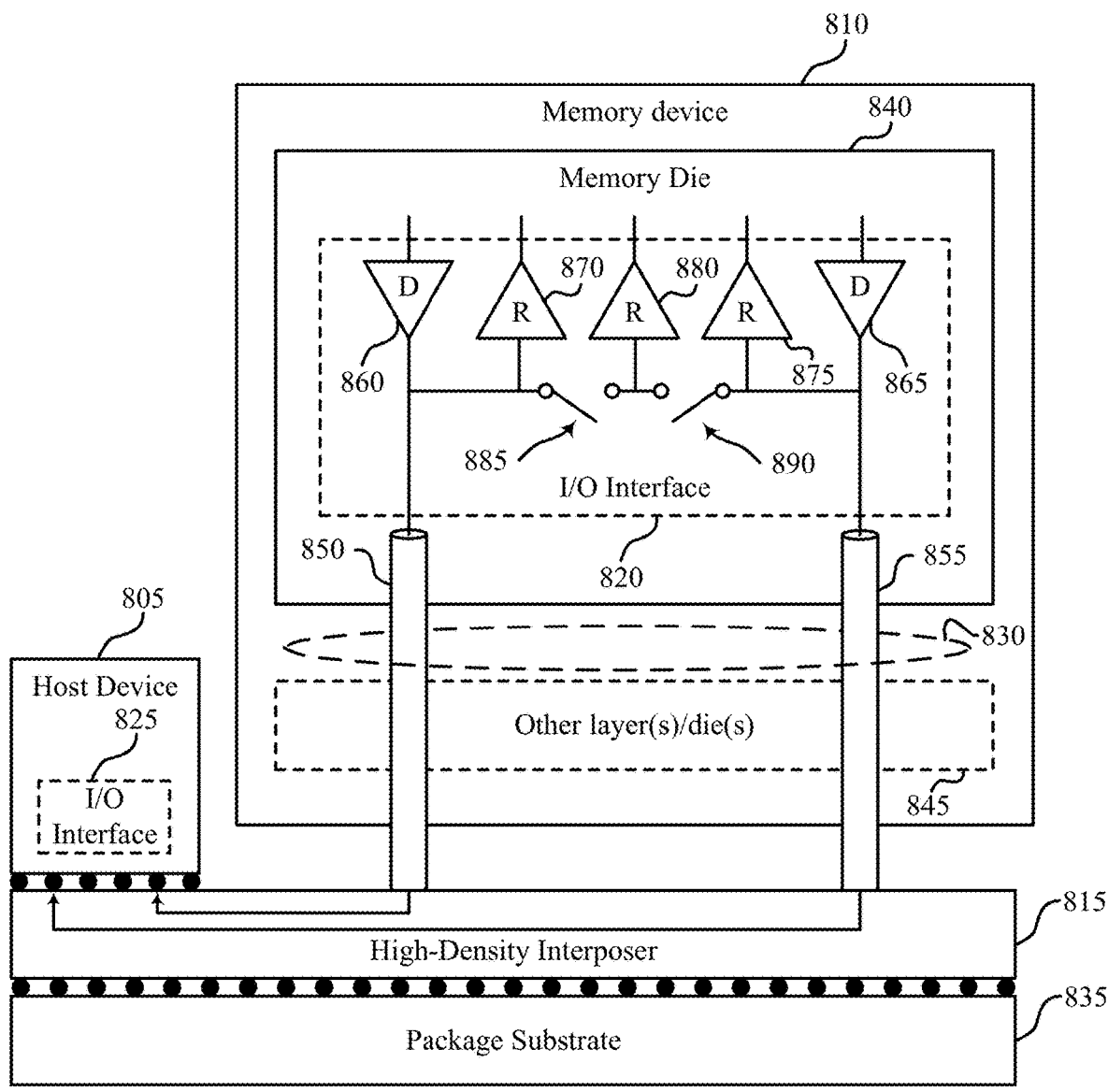
FIG. 8 illustrates an example of a device that supports memory devices with configurable input/output interfaces in accordance with examples of the present disclosure.

FIG. 8 illustrates an example of a device 800 that supports memory devices with configurable input/output interfaces in accordance with various examples of the present disclosure. The device 800 may include channels or I/O interfaces, or both, that are configurable based on the type of substrate used to couple a host device 805 and a memory device 810. Device 800 illustrates an example of a configuration of an I/O interface 820 of the memory device 810 and/or a channel width that are configured based on using the high-density interposer 815 (e.g., a silicon interposer or a glass interposer) to couple the host device 805 with the memory device 810.

The configurable channels and configurable I/O interfaces may allow the memory device 810 to communicate data at a given data rate using a plurality of different substrates to connect to the host device 805. Different types of substrates may have different characteristics which affect their rate of transferring data when compared to other types of substrates. For example, the maximum frequency of a signal transmitted across a high-density interposer may be lower than a maximum frequency of a signal transmitted across an organic substrate because the channels of a high-density interposer may be more resistive and/or lossy than channels of an organic substrate.

To achieve the same rate of data transfer using a high-density interposer or an organic substrate, the device 800 may include configurable I/O interfaces 820, 825 and/or configurable data channels 830. For example, if the device 800 includes the high-density interposer 815, the device 800 may be configured to use a wider channel at a lower frequency and, if the device 800 includes the organic substrate, the device 800 may be configured to use a narrower channel at a higher frequency. In some cases, the device 800 may use different modulation schemes based on the type of substrate used to couple the host device 805 and the memory device 810.

The device 800 may include a host device 805 coupled with a memory device 810 using a high-density interposer 815 (e.g. a silicon interposer or a glass interposer), and a package substrate 835. The device 800 may be an example of the device 700 described with reference to FIG. 7. The host device 805 may be an example of host devices 205, 605, 705 described with reference to FIGS. 2, 6, and 7. The memory device 810 may be an example of the memory devices 210, 300, 610, 710 and portions of memory devices described with reference to FIGS. 2-7. The high-density interposer 815 may be an example of the substrate 310 or the high-density interposer 715 described with reference to FIGS. 3 and 7. The package substrate 835 may be an example of the package substrate 615, 725 described with reference to FIGS. 6 and 7. The high-density interposer 815 may be an example of a material that includes a large number of channels. The number of channels may be larger than channels of other types of connecting materials (e.g., organic substrates). In some cases, the individual channels in the high-density interposer 815 may be more resistive or more lossy than channels of other types of connecting materials (e.g., organic substrates).

The memory device 810 may include one or more memory dies 840 that include memory cells. The device 800 illustrates a first memory die 840 that includes the I/O interface 820 and illustrates one or more other layers or other memory dies 845. The memory die 840 may be an example of memory dies 100, 305, 400, 620, 720 described with reference to FIGS. 1, 3, 4, 6, and 7.

The memory device 810 may also include one or more data channels 830. The channels may include one or more pins 850, 855. A pin 850 or 855 may include any conductive path, or any portion of a conductive path, configured to communicate signals between the memory device 810 and the host device 805. In some cases, at least a portion of the pins 850, 855 may each be examples of or coupled with TSVs. For example, when a pin 850 or 855 travels through an intermediate layer (e.g., other layer(s)/die(s) 845), a pin 850 or 855 may include a TSV for at least a portion. In some cases, the pins 850, 855 may not use a TSV. For example, when a pin 850 or 855 couples the high-density interposer 815 with a bottom layer of the memory device 810, the conductive path that comprises the pin 850 or 855 may not include a TSV. While in some cases, the functions of the I/O interfaces 820 may be described in the context of a TSV, the principles described herein may generally apply to any pin or conductive path.

The device 800 illustrates a pair of TSVs (e.g., pins 850) in the memory device 810 coupling the memory die 840 with the high-density interposer 815 through one or more intervening layers (e.g., memory dies 845, other layers). Although the device 800 illustrates a single pair of pins 850, 855 and a single I/O interface 820 for the single pair of pins 850, 855, the data channel 830 may comprise many more pins and the functions of the I/O interface 820 may be extended to be implemented with one or more additional pins and one or more additional pairs of pins.

The I/O interface 820 may include two or more configurations that may be implemented based on the type of substrate used to couple the host device 805 and the memory device 810. The I/O interface 820 of the device 800 illustrates an example of a configuration of the I/O interface 820 that may be implemented when a high-density interposer 815 is used to couple the host device 805 with the memory device 810. The I/O interface 820 may include a plurality of drivers 860, 865, a plurality of receivers 870, 875, 880, and one or more switching components 885, 890. The number of possible different configurations of the I/O interface 820 may, in some examples, be based on the number of pins coupled with the I/O interface 820, the number of drivers in the I/O interface 820, the number of receivers in the I/O interface 820, or a combination thereof.

The I/O interface 820 may include a first driver 860 and a second driver 865. In the first configuration associated with the high-density interposer 815, the first driver 860 may be coupled with the first pin 850 and the second driver 865 may be coupled with the second pin 855. In the first configuration, the first driver 860 may be isolated from the second pin 855 and the second driver may be isolated from the first pin 850. The drivers 860, 865 may be configured to generate a signal on the pins 850. For example, the first driver 860 may be configured to generate/transmit a signal on the first pin 850 using any type of modulation scheme. The drivers 860, 865 may each include a plurality of legs. The number of active legs in each driver 860, 865 may vary based on the number of pins coupled with the driver, the electrical load experienced by the driver, the modulation scheme implemented by the driver, the frequency of the signal generated by the driver, or various combinations thereof. The drivers 860, 865 may receive commands and/or information from a memory controller to generate/transmit the signals from the memory die 840.

The I/O interface 820 may include a first receiver 870, a second receiver 875, and a third receiver 880. In the first configuration associated with the high-density interposer 815, the first receiver 870 may be coupled with the first pin 850 and the second receiver 875 may be coupled with the second pin 855. The first and second receivers 870, 875 may be configured to receive and decode signals communicated to the memory die 840. The receivers 870, 875, 880 may also receive or generate a reference signal and compare a received signal to the reference signal. The receivers 870, 875, 880 may be configured to determine a logic state represented by a symbol (or level) of the received signal based on the comparison. The receivers 870, 875, 880 may be configured to work together to determine logic states in a signal based on the type of modulation scheme used. In the first configuration, the third receiver 880 may be isolated from both the first pin 850 and the second pin 855. The first receiver 870 may be isolated from the second pin 855 and the second receiver 875 may be isolated from the first pin 850. The receivers 870, 875, 880 may communicate with a controller to receive, decode, and execute commands and/or data encoded in received signals.

The I/O interface 820 may include a first switching component 885 and a second switching component 890. The switching components 885, 890 may be configured to couple the first pin 850 with the second pin 855 in certain configurations. Such an operation would reduce a channel width of a data channel by electrically making two pins act as a single pin. In the first configuration, the first switching component 885 and the second switching component 890 are in an open configuration thereby isolating the first pin 850 from the second pin 855. The switching components 885, 890 may each be examples of any type of switching device. For example, the switching components 885, 890 may be transistors, physical switches, or another type of device.

In some cases, the memory device may include a user-programmable mode register to indicate which mode or configuration the memory device is to operate. In some instances, the memory device may include pin (held high or low) to indicate which mode or configuration the memory device is to operate. In some instances, different in-situ triggers may be used to determine the mode or configuration. In some cases, the mode or the configuration of the I/O interface 820 may be built into the memory device during manufacturing. For example, the coupling/isolating of the pins from each other may be hard-wired in at some point during the manufacturing of the memory device 810. In some examples, the memory device may have two product skus that may use a metal rev to set the configuration or the mode. In some cases, I/O interface 820 may not include the switching components 885, 890.

The device 800 may include the I/O interface 820 in the first configuration based on a target data transfer rate and the type of communication medium (e.g., organic substrate or high-density interposer) used to couple the host device 805 and the memory device 810. Because there may be a practical upper limit (based on power consumption) to the frequency of signals transmitted across the high-density interposer 815 in some cases, the device 800 may be configured to communicate first signal using the first pin 850 and a second signal, independent of the first signal, using the second pin 855. To communicate these independent signals, the first configuration may be set up to isolate the first pin 850 from the second pin 855. Further, the I/O interface 820 may be configured to modulate the signals using a binary-level modulation scheme. A binary-level modulation scheme is a modulation scheme having two symbols or signal levels (e.g., NRZ). Because the signals are modulated to have two different possible symbols, each pin 850 may be coupled to a single driver 860 or 865 and/or a single receiver 870 or 875. In the first configuration, the third receiver 880 may not be needed by either pin 850 or 855 and, consequently, may be isolated from both pins 850, 855.

Operation of the device 800 in the first configuration may be demonstrated by way of an example. For example, the target data rate for the device 800 is 16 gigabits per second, but the high-density interposer 815 may practically have a data rate limit of around 8 gigabits per second based on the power needed to transmit signals at such frequencies. To achieve the target data rate, the I/O interface 820 may be configured to transmit independent signals using independent pins. By communicating the first signal having a data rate of 8 Gb/s using and a second signal having a data rate of 8 Gb/s, the device 800 may achieve the target data rate of 16 Gb/s.

The host device 805 may also include an I/O interface 825. The I/O interface 825 may be similar to the I/O interface 820. In some cases, the host device 805 may not include the I/O interface 825. In such cases, the memory device 810 may be configured to meet or match performance expectations of the host device 805.

Figure 9:
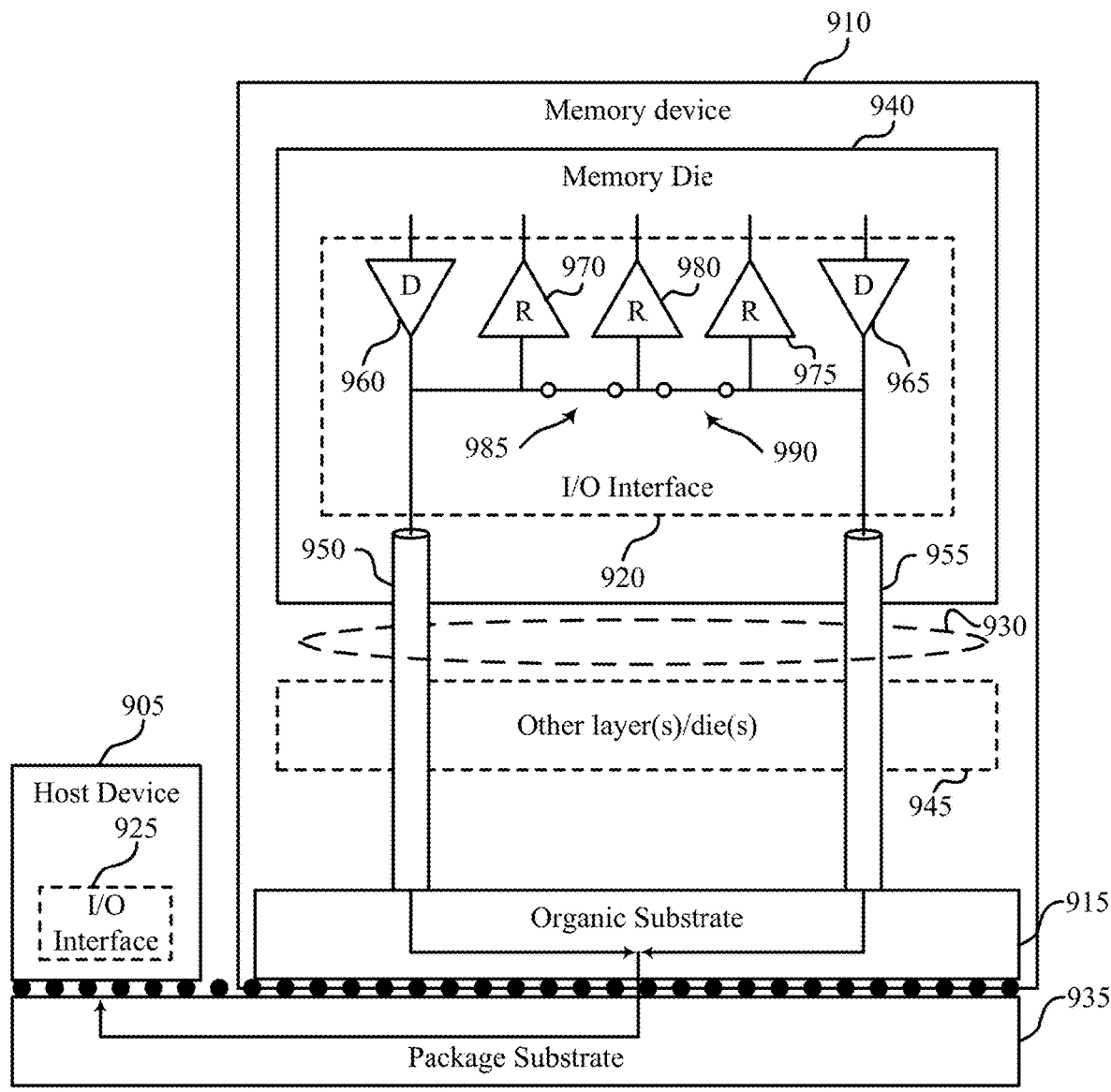
FIG. 9 illustrates an example of a device that supports memory devices with configurable input/output interfaces in accordance with examples of the present disclosure.

FIG. 9 illustrates an example of a device 900 that supports memory devices with configurable input/output interfaces in accordance with various examples of the present disclosure. The device 900 may be similarly embodied as the device 800 described with reference to FIG. 8. As such, components with similar names and references may be embodied similarly. For example, the device 900 may include a host device 905, a memory device 910, an I/O interface 920, an I/O interface 925, channels 930, a package substrate 935, one or more memory dies 940, one or more additional layers and/or memory dies 945, pins 950, 955, drivers 960, 965, receivers 970, 975, 980, and switching components 985, 990.

One difference between the device 900 and the device 800 is that the host device 905 is coupled with the memory device 910 using channels of an organic substrate, in illustrative example, the organic substrate being the package substrate 935. The memory device 910 may also include an organic substrate 915 on which the memory dies 940 may be positioned. The device 900 may be configured similarly as device 650 described with reference to FIG. 6B. Because channels of the organic substrate (e.g., package substrate 935 and/or organic substrate 915) have different properties than the high-density interposer 815, different signaling characteristics are possible. Consequently, the I/O interfaces 920, 925 may be in a second configuration to achieve the target data rate using different signaling based on the organic substrate being used to communicate signals.

In the second configuration, the I/O interface 920 may be configured couple the two pins 950, 955 together and communicate signals that are modulated using a multi-level modulation scheme. A multi-level modulation scheme may be a M-ary modulation scheme where M>=3. For example, the multi-level modulation scheme may be a PAM4 scheme. Other examples of multi-level modulation schemes may include PAM8, PAM16, QAM4, QAM8, QAM16, QPSK, etc. Because a multi-level modulation scheme is used, it may not necessary to communicate two independent signals across two independent pins to achieve the target data rate. An advantage for building a memory device 910 with twice as many pins/TSVs as needed may be to increase manufacturing yield rates of such memory devices and/or provide redundant conductive paths to be used for signaling. The device 900 when in the second configuration of the I/O interface 920 may be configured to satisfy the target data rate using narrower channel.

To communicate using the second configuration of the I/O interface 920, the I/O interface 920 may couple the first pin 950 with the second pin 955. Such a coupling would cause the two pins 950, 955 to electrically act as a single pin. Switching components 985 and 990 may be put in a closed position to accomplish the coupling. In some cases, the I/O interface 920 may be configured to be dynamically switched between the first configuration, the second configuration, and/or any other possible configurations. For example, the memory device may include a user-programmable mode register to indicate which mode or configuration the memory device is to operate.

In some instances, the memory device may include a pin (held high or low) to indicate which mode or configuration the memory device is to operate. In some instances, different in-situ triggers may be used to determine the mode or configuration. In some cases, the mode or the configuration of the I/O interface 920 may be built into the memory device during manufacturing. For example, the coupling/isolating of the pins from each other may be hard-wired in at some point during the manufacturing of the memory device 810. In some examples, the memory device may have two product skus that may use a metal rev to set the configuration or the mode. For example, I/O interface 920 may not include the switching components 985, 990.

When the pins 950, 955 are coupled together, the first driver 960 and the second driver 965 may be coupled to both the first pin 950 and the second pin 955. In the second configuration, the first driver 960 and the second driver 965 may be configured to cooperate to transmit signals across the first pin 950, the second pin 955, or both. When both drivers 960, 965 are being used to generate/transmit signals, the drive strength of each driver may be configured based on the load of the pins 950, 955 and/or the modulation scheme being used. The drive strength may be changed by activating/deactivating a certain number of legs of the drivers 960, 965. For example, when transmitting signals modulating using PAM4, a most-significant bit (MSB) driver (e.g., the first driver 960) may have a drive strength that is twice as strong as a least-significant bit (LSB) driver (e.g., the second driver 965). Such a relationship may provide even spacing between the different levels in the PAM4 modulated signal. A drive strength may refer to a data bus signal strength, a pull-up voltage strength, or a pull-down voltage strength of a driver. A drive strength may similarly refer to the output impedance of a driver, a pull-up output impedance formed across a transistor and resistor, or a transistor alone, and a pull-down output impedance formed across a transistor and resistor, or a transistor alone.

When the pins 950, 955 are coupled together, the first, second, and third receivers 970, 975, 980 may be coupled to both the first pin 950 and the second pin 955. The receivers 970, 975, 980 may be configured to receive and detect multi-level signal where M=4 (e.g., PAM4). As the number of symbols (e.g., levels in some cases) in a modulation scheme increases, the number of comparators needed to distinguish the symbols increases. To decode a PAM4 signal the I/O interface 920 may include three receivers 970, 975, 980 each comparing the signal to a different reference voltage. In some cases, more or fewer receivers may be used in the I/O interface 920. The reference voltages used by each receiver 970, 975, 980 in the second configuration may be different than the reference voltages used by the receivers 870, 875 in the first configuration. In the first configuration, the first and second receivers 870, 875 may use the same or a similar reference signal and the third receiver 880 may not use a reference signal at all. In the second configuration, each receiver 970, 975, 980 may use different reference signals.

When decoding a multi-level signal, the I/O interface 920 may include additional circuitry or components. For example, the receivers 970, 975, 980 may send their outputs to circuitry that determines a logic state based on the outputs of all three receivers 970, 975, 980. By comparing the output of each receiver 970, 975, 980, the circuitry may be configured to determine the two bits represented by a single PAM4 symbol included in the received signal.

The illustrative I/O interfaces 820, 920 are capable of two configurations, a first configuration for communicating signals modulated using a binary-level modulation scheme and a second configuration for communicating signals modulated using a 4-level modulation scheme (e.g., PAM4). The I/O interfaces 820, 920 may be include components for supporting any number of communications. For example, the I/O interfaces 820, 920 may include components to support signals modulated using any type of M-ary modulation scheme (e.g., M=3, 4, 5, 6, 7, 8, etc.). For example, in an 8-level modulation scheme, the I/O interfaces 820, 920 may be coupled to three pins, may include three or more drivers, and may include seven or more receivers.

In some cases, the pins of the devices 800 or 900 may be point-to-point connections. Meaning, the pins may communicate with a single memory die in the stack of memory dies. In some cases, the pins of the devices 800 or 900 may be busses that are coupled with a plurality of memory dies in the stack of memory dies. In some cases, one of the pins in a pin pair coupled to an I/O interface may be point-to-point connection and the other pin may be a bus.

In some cases, the TSVs 950, 955 may be shorted together before being routed to the host device 905. In some examples, the TSVs 950, 955 may be shorted together in the organic substrate 915, as shown in FIG. 9. In other examples, the TSVs 950, 955 may be shorted together in structures other than the organic substrate. Each pair of TSVs may be connected through a singular contact.

For example, the device 900 may not include the organic substrate 915 and any functions of the organic substrate 915 may be performed by the package substrate 935. In such examples, the TSVs 950, 955 may be shorted together in the package substrate 935, rather than in the organic substrate 915. In such examples, the package substrate 935 may support a complete interconnect between the host device 905 and the memory device 910. In such examples, the package substrate 915 may be an organic substrate.

In other examples, the TSVs 950, 955 may be shorted together in a bottom layer of the other layers 945. In such examples, bottom layer of the other layers 945 may be bumped to the package substrate 935 at twice the pitch. Thus, the device 900 may present a number of external contacts which is less than the number of TSVs to the routing substrate (e.g., the bottom layer of the other layers 945) and still obtain the functionality associated with shorting the TSVs in the organic substrate 915.

In one example, a device or system may include an array of memory cells coupled with a host device through a substrate, a first TSV configured between the array of memory cells and the substrate, a second TSV that is selectively couplable with the first TSV, the first TSV and the second TSV configured to couple memory cells of the array of memory cells with the host device via the substrate, and an I/O interface coupled with the first TSV and the second TSV and configurable between a first configuration and a second configuration based at least in part on a type of the substrate.

Some examples of the device or system described above may also include one or more switching components configured to isolate the first TSV from the second TSV in the first configuration and to couple the first TSV with the second TSV in the second configuration. In some examples of the device or system described above, the type of the substrate may be a silicon interposer or an organic substrate.

In some examples of the device or system described above, the I/O interface comprises: a first driver and a second driver each configured to transmit one or more signals from the array of memory cells. In some examples of the device or system described above, a plurality of receivers configured to receive one or more signals at the array of memory cells.

In some examples of the device or system described above, the I/O interface, in the first configuration, comprises: the first driver and a first receiver of the plurality of receivers coupled with the first TSV. In some examples of the device or system described above, the second driver and a second receiver of the plurality of receivers coupled with the second TSV.

In some examples of the device or system described above, the I/O interface, in the first configuration, comprises: the first driver and the first receiver isolated from the second driver and the second receiver. In some examples of the device or system described above, the I/O interface, in the first configuration, comprises: a third receiver of the plurality of receivers isolated from the first TSV and the second TSV.

In some examples of the device or system described above, the first driver and the first receiver may be configured to communicate a first set of signals modulated using a modulation scheme having two levels using the first TSV when the I/O interface may be in the first configuration. In some examples of the device or system described above, the second driver and the second receiver may be configured to communicate a second set of signals modulated using the modulation scheme having two levels using the second TSV when the I/O interface may be in the first configuration, the second set of signals being different from the first set of signals.

In some examples of the device or system described above, the I/O interface, in the second configuration, comprises: the first driver and the second driver coupled with the first TSV and the second TSV. In some examples of the device or system described above, the plurality of receivers coupled with the first TSV and the second TSV.

In some examples of the device or system described above, the first driver and the second driver may be configured to transmit a first set of signals modulated using a modulation scheme having three or more levels using the first TSV and the second TSV when the I/O interface may be in the second configuration. In some examples of the device or system described above, the first receiver, second receiver, and third receiver configured to receive a second set of signals modulated using the modulation scheme having three or more levels communicated using the first TSV and the second TSV when the I/O interface may be in the second configuration.

In some examples of the device or system described above, the first driver may be configured with a first drive strength and the second driver may be configured with a second drive strength that may be less than the first drive strength when the I/O interface may be in the second configuration.

In some examples of the device or system described above, the first TSV and the second TSV may be coupled with a plurality of arrays of memory cells positioned in a stack, each array of memory cells of the plurality of arrays having an I/O interface coupled with the first TSV and the second TSV.

In one example, a device or system may include a host device, a substrate configured to couple the host device with a memory device, the memory device including: a first TSV, a second TSV that is selectively couplable with the first TSV, the first TSV and the second TSV configured to couple an array of memory cells of the memory device with the substrate, and an I/O interface coupled with the first TSV and the second TSV and configurable between a first configuration and a second configuration based at least in part on a type of the substrate used to couple the memory device with the host device, wherein the I/O interface is configurable to: communicate, in the first configuration, a first set of signals modulated using a first modulation scheme having two levels over the first TSV and a second set of signals modulated using the first modulation scheme over the second TSV, and communicate, in the second configuration, a third set of signals modulated using a second modulation scheme having three or more levels over the first TSV and the second TSV.

In some examples of the device or system described above, the I/O interface may be configured to operate using the first configuration when the substrate may be a high-density interposer. In some examples of the device or system described above, the I/O interface may be configured to operate using the second configuration when the substrate may be an organic substrate.

In some examples of the device or system described above, the host device includes a second I/O interface configurable between a third configuration and a fourth configuration based at least in part on the type of the substrate used to couple the memory device with the host device.

In some examples of the device or system described above, the second I/O interface may be configurable to: communicate the first set of signals and the second set of signals modulated using the first modulation scheme when in the third configuration. Some examples of the device or system described above may also include communicating the third set of signals modulated using the second modulation scheme when in the fourth configuration.

Figure 10:
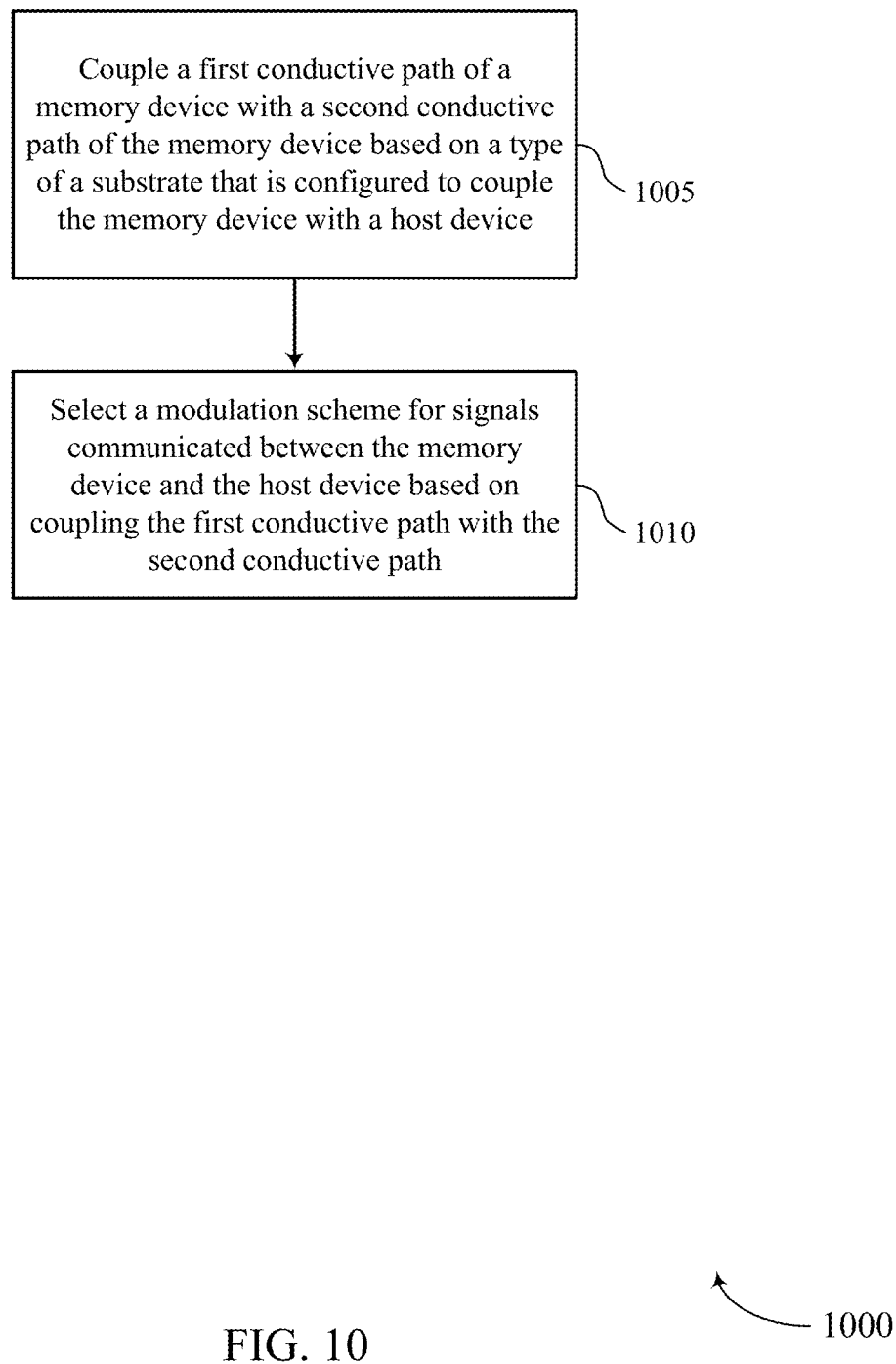
FIGS. 10-13 illustrate a method or methods for memory devices with configurable input/output interfaces in accordance with examples of the present disclosure.

FIG. 10 shows a flowchart illustrating a method 1000 for memory device with configurable input/output interface in accordance with aspects of the present disclosure. The operations of method 1000 may be implemented by a controller or its components as described herein. In some cases, the controller may be a memory controller of a memory device. In some cases, the controller may be configured to control one or more manufacturing processes of the memory device. In some examples, a controller may execute a set of codes to control the functional elements of the device to perform the functions described below. Additionally or alternatively, the controller may perform aspects of the functions described below using special-purpose hardware.

At 1005 the controller may couple a first conductive path of a memory device with a second conductive path of the memory device based at least in part on a type of a substrate that is configured to couple the memory device with a host device.

At 1010 the controller may select a modulation scheme for signals communicated between the memory device and the host device based at least in part on coupling the first conductive path with the second conductive path.

An apparatus for performing the method 1000 is described. The apparatus may include means for coupling a first conductive path of a memory device with a second conductive path of the memory device based at least in part on a type of a substrate that is configured to couple the memory device with a host device and means for modifying a modulation scheme for modulating signals communicated between the memory device and the host device based at least in part on coupling the first conductive path with the second conductive path.

Some examples of the method and apparatus described above may further include processes, features, means, or instructions for activating a switching component of the memory device based at least in part on the type of the substrate that may be configured to couple the array of memory cells with the host device.

Some examples of the method and apparatus described above may further include processes, features, means, or instructions for coupling a first driver and a first receiver in electronic communication with the first conductive path with a second driver and a second receiver in electronic communication with the second conductive path based at least in part on the type of the substrate, where the first driver, second driver, first receiver, and second receiver may be coupled with both the first conductive path and the second conductive path.

Some examples of the method and apparatus described above may further include processes, features, means, or instructions for coupling a third receiver to the first conductive path and the second conductive path based at least in part on the type of the substrate.

Some examples of the method and apparatus described above may further include processes, features, means, or instructions for modifying a reference voltage applied to the first receiver or the second receiver based at least in part on coupling the third receiver to the first conductive path and the second conductive path.

Some examples of the method and apparatus described above may further include processes, features, means, or instructions for communicating with the host device by signals modulated using a multi-level modulation scheme having three or more levels based at least in part on identifying the type of the substrate as an organic substrate.

Some examples of the method and apparatus described above may further include processes, features, means, or instructions for communicating with the host device by signals modulated using a binary-level modulation scheme having two levels based at least in part on identifying the type of the substrate as a high-density interposer.

Some examples of the method and apparatus described above may further include processes, features, means, or instructions for modifying a drive strength of at least two drivers coupled with the first conductive path and the second conductive path based at least in part on coupling the first conductive path with the second conductive path.

Figure 11:
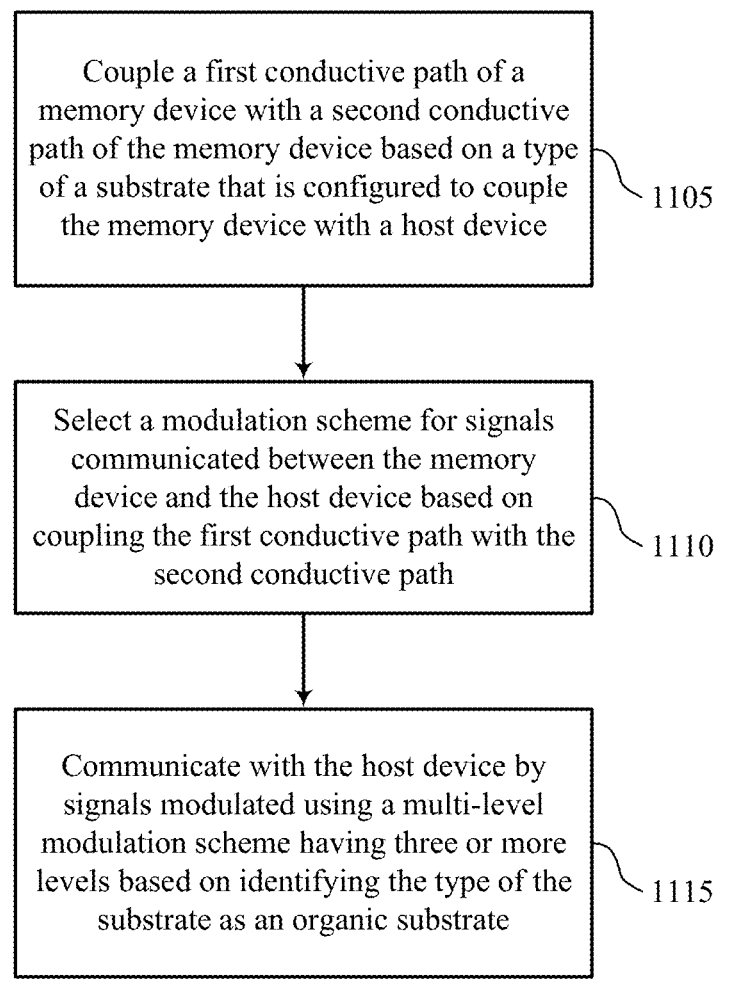

FIG. 11 shows a flowchart illustrating a method 1100 for memory device with configurable input/output interface in accordance with aspects of the present disclosure. The operations of method 1100 may be implemented by a controller or its components as described herein. In some cases, the controller may be a memory controller of a memory device. In some cases, the controller may be configured to control one or more manufacturing processes of the memory device. In some examples, a controller may execute a set of codes to control the functional elements of the device to perform the functions described below. Additionally or alternatively, the controller may perform aspects of the functions described below using special-purpose hardware.

At 1105 the controller may couple a first conductive path of a memory device with a second conductive path of the memory device based at least in part on a type of a substrate that is configured to couple the memory device with a host device.

At 1110 the controller may select a modulation scheme for signals communicated between the memory device and the host device based at least in part on coupling the first conductive path with the second conductive path.

At 1115 the controller may communicate with the host device by signals modulated using a multi-level modulation scheme having three or more levels based at least in part on identifying the type of the substrate as an organic substrate.

Figure 12:
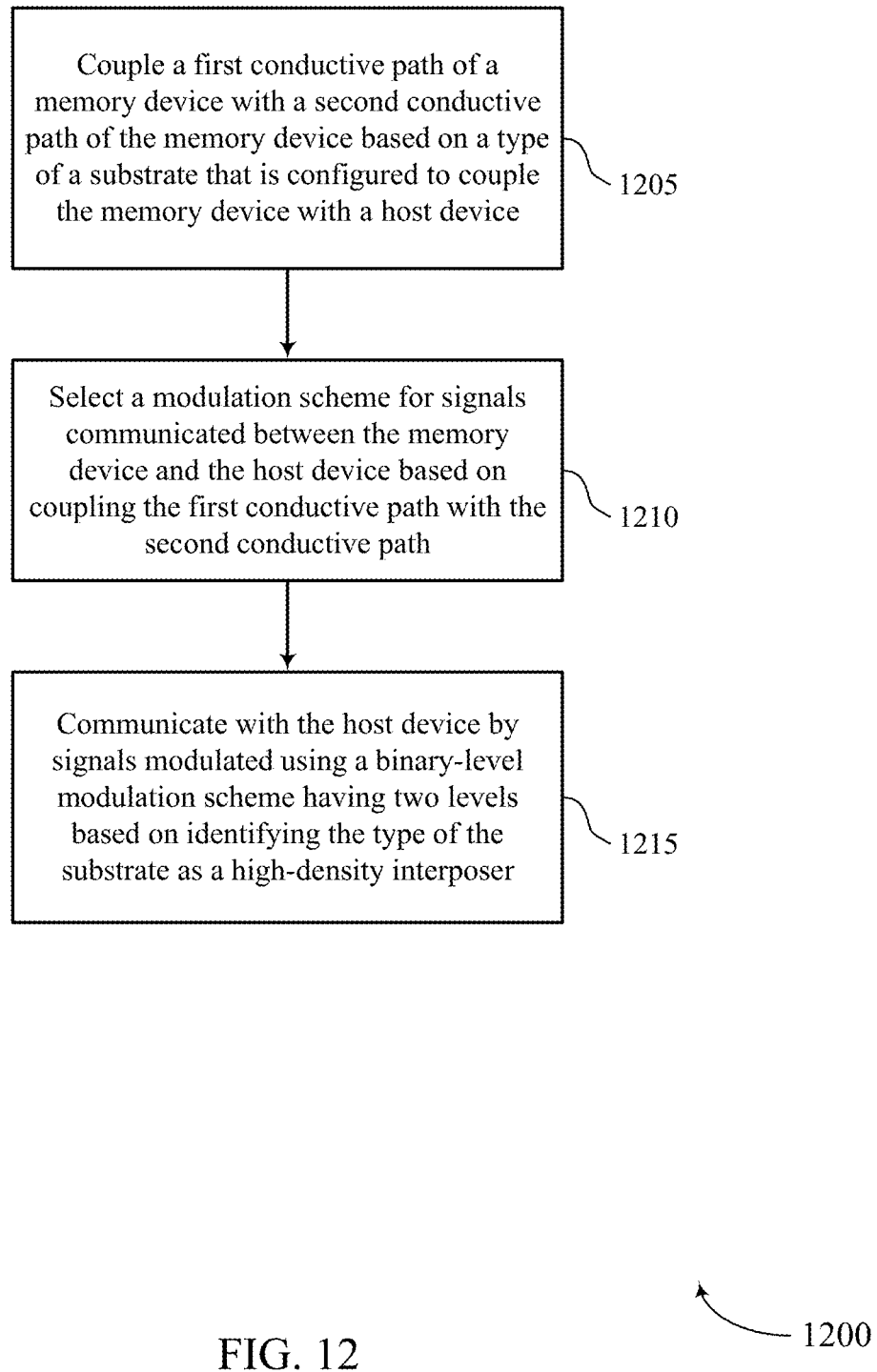

FIG. 12 shows a flowchart illustrating a method 1200 for memory device with configurable input/output interface in accordance with aspects of the present disclosure. The operations of method 1200 may be implemented by a controller or its components as described herein. In some cases, the controller may be a memory controller of a memory device. In some cases, the controller may be configured to control one or more manufacturing processes of the memory device. In some examples, a controller may execute a set of codes to control the functional elements of the device to perform the functions described below. Additionally or alternatively, the controller may perform aspects of the functions described below using special-purpose hardware.

At 1205 the controller may couple a first conductive path of a memory device with a second conductive path of the memory device based at least in part on a type of a substrate that is configured to couple the memory device with a host device.

At 1210 the controller may select a modulation scheme for signals communicated between the memory device and the host device based at least in part on coupling the first conductive path with the second conductive path.

At 1215 the controller may communicate with the host device by signals modulated using a binary-level modulation scheme having two levels based at least in part on identifying the type of the substrate as a high-density interposer.

Figure 13:
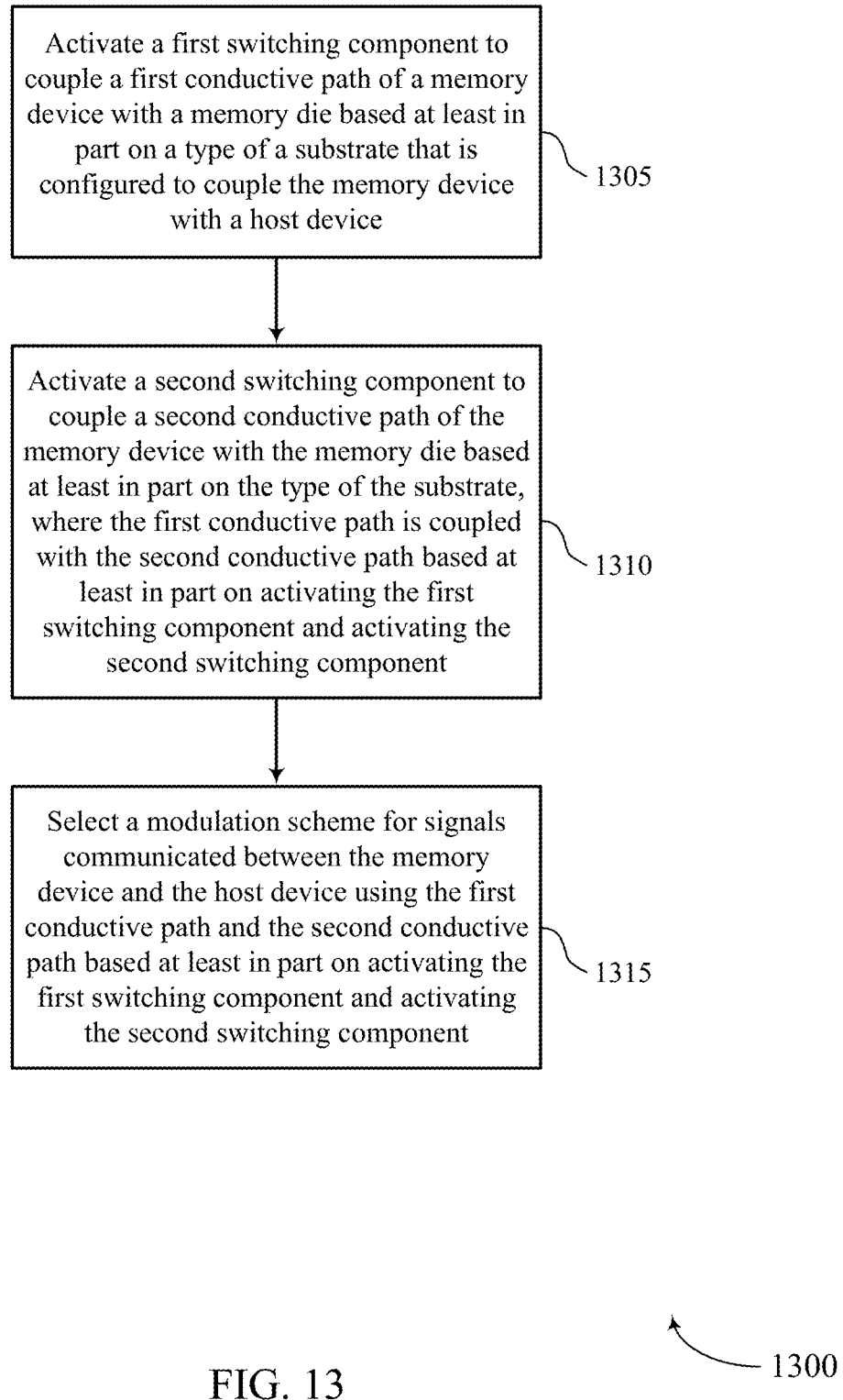

FIG. 13 shows a flowchart illustrating a method 1300 for memory device with configurable input/output interface in accordance with aspects of the present disclosure. The operations of method 1300 may be implemented by a controller or its components as described herein. In some cases, the controller may be a memory controller of a memory device. In some cases, the controller may be configured to control one or more manufacturing processes of the memory device. In some examples, a controller may execute a set of codes to control the functional elements of the device to perform the functions described below. Additionally or alternatively, the controller may perform aspects of the functions described below using special-purpose hardware.

At 1305 the controller may activate a first switching component to couple a first conductive path of a memory device with a memory die based at least in part on a type of a substrate that is configured to couple the memory device with a host device.

At 1310 the controller may activate a second switching component to couple a second conductive path of the memory device with the memory die based at least in part on the type of the substrate, where the first conductive path is coupled with the second conductive path based at least in part on activating the first switching component and activating the second switching component.

At 1315 the controller may select a modulation scheme for signals communicated between the memory device and the host device using the first conductive path and the second conductive path based at least in part on activating the first switching component and activating the second switching component.

An apparatus for performing the method 1300 is described. The apparatus may include means for activating a first switching component to couple a first conductive path of a memory device with a memory die based at least in part on a type of a substrate that is configured to couple the memory device with a host device, means for activating a second switching component to couple a second conductive path of the memory device with the memory die based at least in part on the type of the substrate, where the first conductive path is coupled with the second conductive path based at least in part on activating the first switching component and activating the second switching component, and means for select a modulation scheme for signals communicated between the memory device and the host device using the first conductive path and the second conductive path based at least in part on activating the first switching component and activating the second switching component.

In some examples of the method 1300 and/or the apparatus a first driver and a first receiver in electronic communication with the first conductive path are coupled with a second driver and a second receiver in electronic communication with the second conductive path based at least in part on activating the first switching component and activating the second switching component. In some examples of the method 1300 and/or the apparatus a third receiver is coupled with the first conductive path and the second conductive path based at least in part on activating the first switching component and activating the second switching component. Some examples of the method 1300 and/or apparatus described above may further include processes, features, means, or instructions for modifying a drive strength of at least two drivers coupled with the first conductive path and the second conductive path based at least in part on activating the first switching component and activating the second switching component.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, components, and modules described in connection with the disclosure herein may be implemented or performed with a general-purpose processor, a DSP, an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    coupling a first conductive path of a memory device with a second conductive path of the memory device based at least in part on a type of a substrate that is configured to couple the memory device with a host device;
    selecting a modulation scheme for signals communicated between the memory device and the host device based at least in part on coupling the first conductive path with the second conductive path; and
    coupling a first driver and a first receiver in electronic communication with the first conductive path with a second driver and a second receiver in electronic communication with the second conductive path based at least in part on the type of the substrate, wherein the first driver, the second driver, the first receiver, and the second receiver are coupled with both the first conductive path and the second conductive path.

2. The method of claim 1, further comprising:
    activating a switching component of the memory device based at least in part on the type of the substrate that is configured to couple an array of memory cells with the host device.

3. The method of claim 1, further comprising:
    coupling a third receiver to the first conductive path and the second conductive path based at least in part on the type of the substrate.

4. The method of claim 3, further comprising:
    modifying a reference voltage applied to the first receiver or the second receiver based at least in part on coupling the third receiver to the first conductive path and the second conductive path.

5. The method of claim 1, further comprising:
    communicating with the host device by signals modulated using a multi-level modulation scheme having three or more levels based at least in part on identifying the type of the substrate as an organic substrate.

6. The method of claim 1, further comprising:
    communicating with the host device by signals modulated using a binary-level modulation scheme having two levels based at least in part on identifying the type of the substrate as a high-density interposer.

7. The method of claim 1, further comprising:
    modifying a drive strength of at least two drivers coupled with the first conductive path and the second conductive path based at least in part on coupling the first conductive path with the second conductive path.

8. An apparatus, comprising:
    an array of memory cells;
    a first conductive path coupled with the array of memory cells;
    a second conductive path coupled with the array of memory cells;
    an interface configurable between a first configuration and a second configuration; and
    a controller coupled with the interface, the controller operable to:
        couple the first conductive path with the second conductive path based at least in part on a type of a substrate associated with the array of memory cells, the substrate configured to couple a memory device with a host device; and
        select a modulation scheme for signals communicated between the memory device and the host device using the first conductive path or the second conductive path based at least in part on coupling the first conductive path with the second conductive path.

9. The apparatus of claim 8, wherein the controller is operable to:
    activate a switching component of the memory device based at least in part on the type of the substrate that is configured to couple the array of memory cells with the host device.

10. The apparatus of claim 8, wherein the controller is operable to:
    couple a first driver and a first receiver in electronic communication with the first conductive path with a second driver and a second receiver in electronic communication with the second conductive path based at least in part on the type of the substrate, wherein the first driver, the second driver, the first receiver, and the second receiver are coupled with both the first conductive path and the second conductive path.

11. The apparatus of claim 10, wherein the controller is operable to:
    couple a third receiver to the first conductive path and the second conductive path based at least in part on the type of the substrate.

12. The apparatus of claim 11, wherein the controller is operable to:
  modify a reference voltage applied to the first receiver or the second receiver based at least in part on coupling the third receiver to the first conductive path and the second conductive path.

13. The apparatus of claim 8, wherein the controller is operable to:
  communicate with the host device by signals modulated using a multi-level modulation scheme having three or more levels based at least in part on identifying the type of the substrate as an organic substrate.

14. The apparatus of claim 8, wherein the controller is operable to:
  communicate with the host device by signals modulated using a binary-level modulation scheme having two levels based at least in part on identifying the type of the substrate as a high-density interposer.

15. The apparatus of claim 8, wherein the controller is operable to:
  modify a drive strength of at least two drivers coupled with the first conductive path and the second conductive path based at least in part on coupling the first conductive path with the second conductive path.

16. A method, comprising:
  activating a first switching component to couple a first conductive path of a memory device with a memory die based at least in part on a type of a substrate that is configured to couple the memory device with a host device;
  activating a second switching component to couple a second conductive path of the memory device with the memory die based at least in part on the type of the substrate, wherein the first conductive path is coupled with the second conductive path based at least in part on activating the first switching component and activating the second switching component, wherein a first driver and a first receiver in electronic communication with the first conductive path are coupled with a second driver and a second receiver in electronic communication with the second conductive path based at least in part on activating the first switching component and activating the second switching component; and
  selecting a modulation scheme for signals communicated between the memory device and the host device using the first conductive path and the second conductive path based at least in part on activating the first switching component and activating the second switching component.

17. The method of claim 16, wherein a third receiver is coupled with the first conductive path and the second conductive path based at least in part on activating the first switching component and activating the second switching component.

18. The method of claim 16, further comprising:
  modifying a drive strength of at least two drivers coupled with the first conductive path and the second conductive path based at least in part on activating the first switching component and activating the second switching component.

19. A method, comprising:
  coupling a first conductive path of a memory device with a second conductive path of the memory device based at least in part on a type of a substrate that is configured to couple the memory device with a host device;
  selecting a modulation scheme for signals communicated between the memory device and the host device based at least in part on coupling the first conductive path with the second conductive path; and
  modifying a drive strength of at least two drivers coupled with the first conductive path and the second conductive path based at least in part on coupling the first conductive path with the second conductive path.

20. The method of claim 19, further comprising:
  communicating with the host device by signals modulated using a multi-level modulation scheme having three or more levels based at least in part on identifying the type of the substrate as an organic substrate.

* * * * *